(12) United States Patent
Tan et al.

(10) Patent No.: US 11,915,911 B2
(45) Date of Patent: Feb. 27, 2024

(54) TWO PIECE ELECTRODE ASSEMBLY WITH GAP FOR PLASMA CONTROL

(71) Applicant: Applied Materials, Inc., Santa Clara, CA (US)

(72) Inventors: Tien Fak Tan, Campbell, CA (US); Saravjeet Singh, Sunnyvale, CA (US); Dmitry Lubomirsky, Cupertino, CA (US); Tae Wan Kim, San Jose, CA (US); Kenneth D. Schatz, Los Altos, CA (US); Tae Seung Cho, San Jose, CA (US); Lok Kee Loh, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 279 days.

(21) Appl. No.: 16/915,028

(22) Filed: Jun. 29, 2020

(65) Prior Publication Data
US 2020/0328065 A1    Oct. 15, 2020

Related U.S. Application Data

(63) Continuation of application No. 15/955,588, filed on Apr. 17, 2018, now Pat. No. 10,699,879.

(51) Int. Cl.
*H01J 37/32* (2006.01)
*H01J 37/04* (2006.01)

(52) U.S. Cl.
CPC ........ *H01J 37/32091* (2013.01); *H01J 37/04* (2013.01)

(58) Field of Classification Search
CPC . H01J 37/04; H01J 37/32091; H01J 37/32568
See application file for complete search history.

(56) References Cited

U.S. PATENT DOCUMENTS

| 10,699,879 B2 | 6/2020 | Tan et al. |
| 2009/0236547 A1 | 9/2009 | Huang et al. |

(Continued)

FOREIGN PATENT DOCUMENTS

| JP | 03292731 A | * | 12/1991 |
| JP | 2007096354 A | * | 4/2007 |

(Continued)

OTHER PUBLICATIONS

International Search Report and Written Opinion dated Aug. 1, 2019 in International Patent Application No. PCT/US2019/027544, 11 pages.

(Continued)

*Primary Examiner* — Yuechuan Yu
(74) *Attorney, Agent, or Firm* — Kilpatrick Townsend & Stockton LLP

(57) ABSTRACT

An apparatus for distributing plasma products includes first and second electrodes that each include planar surfaces. The first electrode forms first apertures from a first planar surface to a second planar surface; the second electrode forms second apertures from the third planar surface to the fourth planar surface. The electrodes couple through one or more adjustable couplers such that the third planar surface is disposed adjacent to the second planar surface with a gap therebetween, the gap having a gap distance. Each of the adjustable couplers has a range of adjustment. The first and second apertures are arranged such that for at least one position within the ranges of adjustment, none of the first apertures aligns with any of the second apertures to form an open straight-line path extending through both the first and second electrodes.

20 Claims, 19 Drawing Sheets

(56) References Cited

U.S. PATENT DOCUMENTS

2011/0049102 A1    3/2011   Kroll et al.
2011/0290419 A1   12/2011   Horiguchi et al.
2016/0240344 A1    8/2016   Kemen et al.
2016/0293388 A1* 10/2016   Chen ................ H01J 37/32568

FOREIGN PATENT DOCUMENTS

| TW | 565903 B | 12/2003 |
| TW | M299917 U | 10/2006 |
| TW | 2016-08935 A | 3/2016 |
| TW | I609442 B | 12/2017 |
| TW | 2018-14787 A | 4/2018 |

OTHER PUBLICATIONS

International Preliminary Report on Patentability dated Oct. 20, 2020 in International Patent Application No. PCT/US2019/027544, 6 pages.

\* cited by examiner

TWO PIECE ELECTRODE ASSEMBLY WITH GAP FOR PLASMA CONTROL

CROSS-REFERENCES TO RELATED APPLICATIONS

The present application is a continuation of U.S. patent application Ser. No. 15/955,588, filed Apr. 17, 2018, the contents of which are hereby incorporated by reference in their entirety for all purposes.

TECHNICAL FIELD

The present disclosure relates to plasma processing systems.

BACKGROUND

In plasma processing, plasmas create species such as radicals, excited molecular species, molecular fragments, individual atoms and/or free electrons from a source gas. Mixtures of such species, with or without untransformed portions of the source gas, and with or without further gases mixed in, are called "plasma products" herein. Plasma processing brings plasma products into contact with workpieces that may be, for example, semiconductor wafers. To create and/or maintain a plasma, one or more radio frequency (RF) and/or microwave generators typically provide electromagnetic power to a region that contains the source gas. The plasma can be generated from the source gas in the location of one or more wafers being processed, and/or in a first, "upstream" location, after which the plasma products move to a second, "downstream" location to contact the wafer(s). Some systems generate one, two or more plasmas in different locations before the plasma products ultimately contact the wafer(s). Source gases, plasma products and/or other gases mixed with the plasma products often contain highly energetic, charged and/or corrosive species, and/or highly energetic electrons, such that the plasma equipment can sometimes degrade from contact with these materials. This can make materials and/or coatings of plasma system components critical to the longevity and maintenance requirements of the system. Wafer processing can also be affected, and therefore controlled by, the relative presence or absence of certain components of plasma products.

SUMMARY

In one or more embodiments, an apparatus for distributing plasma products includes a first electrode and a second electrode. The first electrode includes a first planar surface and a second planar surface separated by a first electrode thickness that is between 0.125 inch and 1.000 inch. The first electrode forms a plurality of first apertures extending therethrough, from the first planar surface to the second planar surface. The second electrode includes a third planar surface and a fourth planar surface separated by a second electrode thickness that is between 0.125 inch and 1.000 inch. The second electrode forms a plurality of second apertures extending therethrough, from the third planar surface to the fourth planar surface. The second electrode couples with the first electrode through one or more adjustable couplers such that the third planar surface is disposed adjacent to the second planar surface with a gap therebetween, the gap being characterized by a gap distance. Each of the one or more adjustable couplers has a range of adjustment. For at least a first position within the range of adjustment of each of the one or more adjustable couplers, the first and second apertures are arranged within the first and second electrodes, such that none of the first apertures aligns with any of the second apertures to form an open straight-line path extending through both the first and second electrodes, and the gap distance is between 0.005 inch and 0.050 inch.

In one or more embodiments, an apparatus for distributing plasma products includes a first electrode and a second electrode. The first electrode includes a first planar surface and a second planar surface separated by a first electrode thickness that is between 0.125 inch and 1.000 inch. The first electrode forms a plurality of first apertures extending therethrough, from the first planar surface to the second planar surface. The second electrode includes a third planar surface and a fourth planar surface separated by a second electrode thickness that is between 0.125 inch and 1.000 inch. The second electrode is coupled fixedly with the first electrode such that the third planar surface is disposed adjacent to the second planar surface, with a gap distance of 0.005 inches to 0.050 inches therebetween. The first and second apertures are arranged within the first and second electrodes such that none of the first apertures aligns with any of the second apertures to form an open straight-line path extending through both the first and second electrodes.

In one or more embodiments, a plasma source includes a plasma generation region configured for introduction of one or more source gases therein, an RF power supply that provides electromagnetic power to the one or more source gases to ignite a plasma within the plasma generation region, and a two piece electrode assembly that bounds the plasma generation region on one side. The two piece electrode assembly includes a first electrode that defines a first planar surface and a second planar surface. The first planar surface and the second planar surface are separated by a first electrode thickness that is between 0.100 inch and 1.000 inch, and the first electrode forms a plurality of first apertures extending therethrough, from the first planar surface to the second planar surface. The two piece electrode assembly also includes a second electrode that defines a third planar surface and a fourth planar surface. The third planar surface and the fourth planar surface separated by a second electrode thickness that is between 0.100 inch and 1.000 inch, and the second electrode forms a plurality of second apertures extending therethrough, from the third planar surface to the fourth planar surface. The first electrode and the second electrode are fixed or positionable with respect to one another so as to provide a gap between the first electrode and the second electrode, the gap forming a gap distance of 0.005 inches to 0.050 inches between the second planar surface and the third planar surface, and a lateral separation of any point within one of the first apertures, with respect to any point within any of the second apertures, of greater than three times the gap distance. The plasma source further includes a second region that is bounded on at least one side by the fourth planar surface of the second electrode, wherein the gap and the lateral separation cooperate to substantially reduce transmission of free electrons and ionized species from the plasma generation region to the second region.

In one or more embodiments, a method for providing plasma products includes converting at least a portion of a source gas to plasma products, by providing electromagnetic power to the source gas within a plasma generation chamber to generate a plasma, and passing at least a portion of the plasma products through a two piece electrode assembly. The two piece electrode assembly includes a first electrode and a second electrode. The first electrode defines a plurality of first apertures therethrough, a first side of the first electrode facing the plasma such that the portion of the plasma products passes through the plurality of first apertures to a second planar side of the first planar electrode. The second electrode defines a plurality of second apertures therethrough, a third planar side of the second electrode being disposed facing the second side of the first electrode. The second electrode is coupled with the first electrode such that the third planar surface is disposed adjacent to the second planar surface, with a gap distance therebetween. The first and second apertures are arranged within the first and second electrodes such that none of the first apertures aligns with any of the second apertures to form an open straight-line path extending through both the first and second electrodes. The gap distance is sufficient to allow neutral species of the plasma products to pass through the gap as the first portion of the plasma products, but is sufficiently small to cause ionized species of the plasma products to interact with the first or second electrodes and not to pass through the two piece electrode assembly.

In one or more embodiments, a method for optimizing a plasma apparatus includes providing a plasma generation chamber, a downstream chamber, and a two piece electrode assembly therebetween that is operable to modify fluid communication between the plasma generation chamber and the downstream chamber. The two piece electrode assembly includes a first electrode, a second electrode and one or more actuators. The first electrode defines a plurality of first apertures therethrough, a first surface of the first electrode facing the plasma generation chamber and a second planar surface of the first electrode facing away from the plasma generation chamber. The second electrode that defines a plurality of second apertures therethrough, a third planar surface of the second electrode being disposed facing the second planar surface of the first electrode, and a fourth surface of the second electrode facing the downstream chamber. The one or more actuators couple the first and second electrodes, and are operable, in response to an electronic input, to adjust a position of the first electrode relative to a position of the second electrode. The one or more actuators can be operated to provide at least one position of the first electrode relative to the second electrode such that the third planar surface is disposed adjacent to the second planar surface, with a first gap distance between 0.005 inch and 0.050 inch therebetween, and the first and second apertures are arranged within the first and second electrodes such that none of the first apertures aligns with any of the second apertures to form an open straight-line path extending through both the first and second electrodes. The method further includes: establishing a position of the first electrode at a first position relative to the position of the second electrode; operating the plasma generation chamber so as to flow at least a portion of plasma products generated thereby, through the two piece electrode assembly and into the downstream chamber, to process a workpiece; evaluating process results on the workpiece; and operating the electronic input so as to modify the position of the first electrode to a second position relative to the position of the second electrode, in response to the process results.

In one or more embodiments, a method for optimizing a plasma apparatus includes providing a plasma generation chamber, a downstream chamber, and a two piece electrode assembly therebetween that is operable to modify fluid communication between the plasma generation chamber and the downstream chamber. The two piece electrode assembly includes a first electrode, a second electrode and an actuator. The first electrode defines a plurality of first apertures therethrough, a first surface of the first electrode facing the plasma generation chamber and a second planar surface of the first electrode facing away from the plasma generation chamber. The second electrode that defines a plurality of second apertures therethrough, a third planar surface of the second electrode being disposed facing the second planar surface of the first electrode, and a fourth surface of the second electrode facing the downstream chamber. The actuator couples with the first and second electrodes, and is operable to adjust a gap distance between the second and third planar surfaces, the actuator being characterized by a known distance response to an electronic input. The method further includes: operating the electronic input so as to bring a portion of the first electrode into contact with a portion of the second electrode; establishing the electronic input that brings the portion of the first electrode into contact with the portion of the second electrode as a zero value of the electronic input; and further operating the electronic input, relative to the zero value, so as to maintain the gap distance at a desired value, according to the known distance response, to modify the fluid communication between the plasma generation chamber and the downstream chamber.

In one or more embodiments, a method of operating a plasma apparatus includes providing a plasma generation chamber, a downstream chamber, and a two piece electrode assembly therebetween that is operable to modify fluid communication between the plasma generation chamber and the downstream chamber. The two piece electrode assembly includes a first electrode, a second electrode and one or more actuators coupled with the first and second electrodes. The one or more actuators are operable to adjust a position of the first electrode relative to the second electrode. Each of the one or more actuators is characterized by a range of adjustment. For at least one position within the ranges of adjustment of the one or more actuators, the first and second apertures are arranged within the first and second electrodes such that none of the first apertures aligns with any of the second apertures to form an open straight-line path extending through both the first and second electrodes, and the gap distance is between 0.0005 inch and 0.050 inch. The method further includes: operating the one or more actuators so as to dispose the first electrode at a first position relative to the second electrode; operating the plasma generation chamber so as to flow at least a first portion of plasma products generated thereby, through the two piece electrode assembly and into the downstream chamber; operating the one or more actuators so as to dispose the first electrode at a second position relative to the second electrode; and operating the plasma generation chamber so as to flow at least a second portion of plasma products generated thereby, through the two piece electrode assembly and into the downstream chamber. A difference between the first position and the second position causes the two piece electrode assembly to modify a proportion of ionized species to neutral species in the second portion relative to the first portion.

BRIEF DESCRIPTION OF THE DRAWINGS

The present disclosure may be understood by reference to the following detailed description taken in conjunction with the drawings briefly described below, wherein like reference numerals are used throughout the several drawings to refer to similar components. For purposes of illustrative clarity, certain elements in the drawings may not be drawn to scale. Specific instances of an item may be referred to by use of a numeral followed by a second numeral within parentheses (e.g., electrodes 326(1), 326(2) etc.) while numerals not followed by a dash refer to any such item (e.g., electrodes 326). In instances where multiple instances of an item are shown, only some of the instances may be labeled, for clarity of illustration.

In the appended figures, similar components and/or features may have the same reference label. Further, various components of the same type may be distinguished by following the reference label by a numeral that distinguishes among the similar components. If only the first reference label is used in the specification, the description is applicable to any one of the similar components having the same first reference label irrespective of the numeral. Also, several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DETAILED DESCRIPTION

Figure 1:
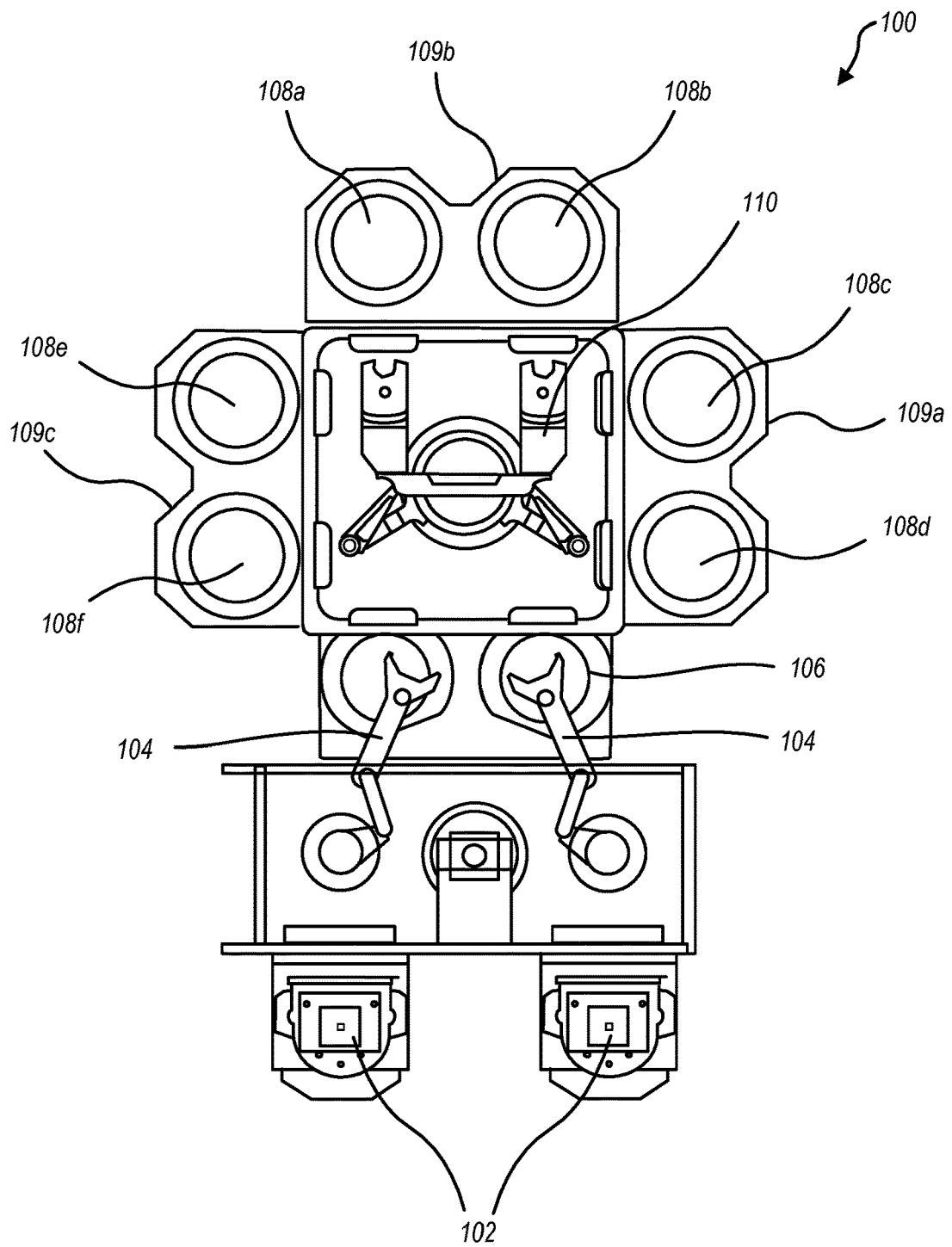
FIG. 1 schematically illustrates major elements of a plasma processing system, in a plan view, according to one or more embodiments.

FIG. 1 schematically illustrates, in a top plan view, major elements of a plasma processing system 100, that may include deposition, etching, baking, and/or curing chambers according to embodiments. System 100 is depicted as a single wafer, semiconductor wafer plasma processing system, but it will be apparent to one skilled in the art that the techniques and principles herein are applicable to plasma generation systems of any type (e.g., systems that do not necessarily process wafers or semiconductors).

In FIG. 1, a pair of front opening unified pods (FOUPs) 102 supply substrates that can be received by robotic arms 104 and placed into a low pressure holding area 106, before being placed into one of processing chambers 108*a-f*, positioned in tandem sections 109*a-c*. A second robotic arm 110 may be used to transport the substrates from the holding area 106 to the processing chambers 108*a-f* and back. Each processing chamber 108*a-f* can be outfitted to perform one or more processing operations. including dry etch processes, cyclical layer deposition (CLD), atomic layer deposition (ALD), chemical vapor deposition (CVD), physical vapor deposition (PVD), etches, pre-cleans, bakes, cures, degassing, orientation, and other processes.

Processing chambers 108*a-f* may include one or more system components for depositing, annealing, curing and/or etching materials on the substrates. In one configuration, two pairs of the processing chambers, e.g., 108*c-d* and 108*e-f*, may be used to deposit material(s) on the substrates, and the third pair of processing chambers, e.g., 108*a-b*, may be used to etch the deposited material(s) and/or the substrates. In another configuration, all three pairs of chambers, e.g., 108*a-f*, may be configured to etch deposited material(s)

and/or the substrates. Any one or more of the processes described may be carried out in chamber(s) separated from the fabrication system shown in different embodiments. It will be appreciated that additional configurations of deposition, etching, annealing, and curing chambers for dielectric films are contemplated by system 100. Certain manufacturers may prefer systems with the flexibility of igniting and/or using plasmas in a variety of configurations, so that each system can be adapted for a corresponding variety of processing needs. The techniques disclosed herein may be adapted to plasma processing systems that ignite and/or use plasmas formed at single or multiple locations.

Although some portions of the present disclosure identify etch processes utilizing the disclosed apparatus and methods, it is to be understood that the apparatus and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the single-chamber operations described. Furthermore, it is noted that the term "chamber" as used herein should be understood as either a cavity in which a wafer or other workpiece is processed through contact with plasma products, or the structure and apparatus that forming such cavity and/or provide such plasma products.

Figure 2:
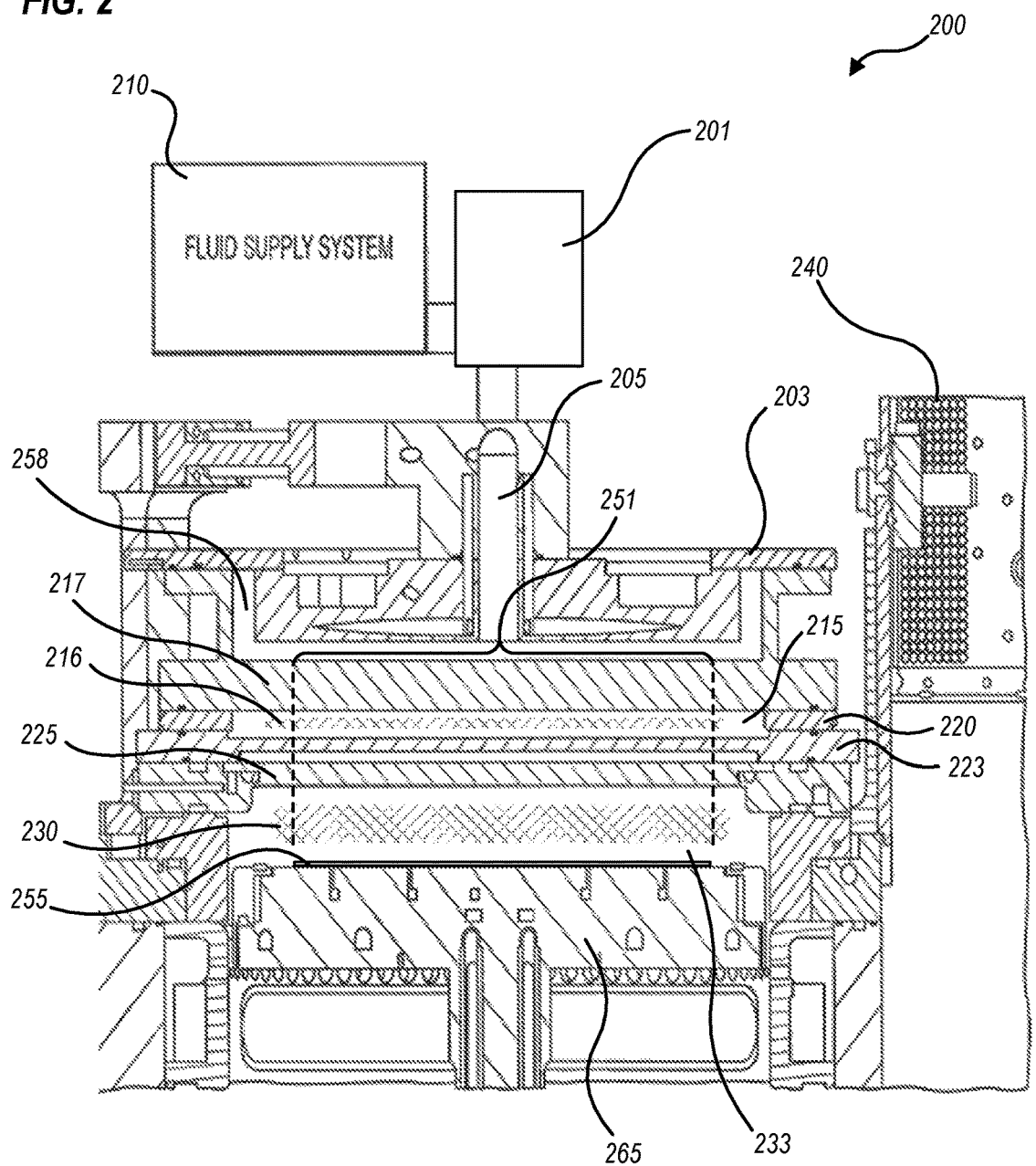
FIG. 2 schematically illustrates a portion of a plasma processing system, in a cross-sectional view, according to one or more embodiments.

FIG. 2 shows a cross-sectional view that schematically illustrates a portion of an exemplary plasma processing system 200. Plasma processing system 200 is an example of plasma processing unit 100, FIG. 1. During etching, a process gas may be flowed into a first plasma generation chamber 215 through a gas inlet assembly 205. A remote plasma system (RPS) 201 may optionally be included in the system, and may process a first gas which then travels through gas inlet assembly 205. Inlet assembly 205 may include two or more distinct gas supply channels where the second channel (not shown) may bypass RPS 201, if included. In the orientation of FIG. 2, a general direction of gas and/or plasma product flow is downwards, and this direction may be referred to as "downstream" herein, while an opposing direction upwards in the orientation of FIG. 2, may be referred to as "upstream." This convention of directions may be used herein, although one skilled in the art will understand that many of the principles described herein are not limited to systems oriented as shown in FIG. 2.

A cooling plate 203, a faceplate 217, an ion suppressor 223, a showerhead 225, and a workpiece support or pedestal 265, with a workpiece 255 disposed thereon, are shown and may each be included according to embodiments. Pedestal 265 may form one or more heat exchange channels through which a heat exchange fluid flows to control the temperature of the substrate, so as to heat and/or cool the workpiece during processing operations. A wafer support platter of pedestal 265 may be formed of aluminum, aluminum alloys, ceramics, or combinations thereof, may also be resistively heated in order to achieve relatively high temperatures, such as from about 100° C. to about 1100° C. or above, using an embedded resistive heater element.

Each of faceplate 217, ion suppressor 223, and showerhead 225 forms apertures for source gases and/or plasma products to pass through for uniform delivery of source gases and/or plasma products to a downstream workpiece processing region 233; such apertures should be understood as present, but not shown in FIG. 2 for clarity of illustration.

Also, although FIG. 2 illustrates each of faceplate 217, ion suppressor 223, and showerhead 225 as solid for clarity of illustration, these components may be formed of multiple parts, as discussed below. Faceplate 217 may be pyramidal, conical, or of another similar structure with a narrow top portion expanding to a wide bottom portion. Faceplate 217 may additionally be flat, as shown.

A portion of system 200 that lies directly above workpiece 255 and extending upwards through at least showerhead 225, ion suppressor 223, and faceplate 217, is called herein a working area 251 of system 200. When workpiece 255 is round (e.g., a semiconductor wafer) working area 251 will also be round. The usual goal of components such as faceplate 217, ion suppressor 223, and showerhead 225 is to distribute gases and plasma products as uniformly as possible within the working area. However, certain embodiments herein can provide one or more added degrees of process control that can, for example, skew or correct processing across working area 251, or introduce radial or other spatial patterns of process effects within working area 251, as discussed below.

Exemplary configurations may include having gas inlet assembly 205 open into a gas supply region 258, that is partitioned from first plasma generation chamber 215 by faceplate 217 so that source gases (or plasma products, if RPS 201 is used) flow through the apertures in faceplate 217 into first plasma generation chamber 215. Structural and operational features may be selected to prevent significant backflow of plasma from first plasma generation chamber 215 back into supply region 258, gas inlet assembly 205, and fluid supply system 210. Faceplate 217, or a conductive top portion of the chamber, and showerhead 225 are shown with an insulating ring 220 located therebetween, to allow a power supply an alternating current (AC) potential to be applied to the faceplate 217 relative to showerhead 225 and/or ion suppressor 223. A power supply that provides the AC potential is called an RF power supply herein, although the power supplied might be in the radio frequency (RF) spectrum or the microwave spectrum. The AC potential enables formation of a capacitively coupled plasma (CCP) in first plasma generation chamber 215. Additional features such as baffles (not shown) may additionally be located in the first plasma generation chamber 215, or otherwise coupled with gas inlet assembly 205, to affect the flow of source gases and/or plasma products through gas inlet assembly 205 into first plasma generation chamber 215.

It should be noted that components such as cooling plate 203, faceplate 217, ion suppressor 223, showerhead 225 and/or other diffusers or screens herein may be characterized as electrodes, as any such components may be individually tied to electrical potentials. Surfaces of any of these components that are exposed to plasma and/or plasma products may be coated either with ceramic layers (e.g., yttria, alumina) or with a suitable passivating layer (e.g., an anodized layer, or a chemically generated alumina layer) for chemical resistance.

Processing system 200 may further include a power supply 240 electrically coupled with any or all of faceplate 217, ion suppressor 223, showerhead 225, and/or pedestal 265 to generate a plasma in first plasma generation chamber 215 and/or processing region 233. Power supply 240 may be configured to deliver an adjustable amount of power to the appropriate electrode(s) depending on the process performed. Such a configuration may allow for a tunable plasma to be used in the processes being performed. Unlike a remote plasma unit, which typically includes on or off functionality, a tunable plasma may be configured to deliver a specific amount of power to first plasma generation chamber 215 and/or processing region 233. This in turn may allow development of particular plasma characteristics such that source gases may be transformed to specific plasma products to enhance processing objectives such as etching profiles, selectivity, uniformity and the like.

In use, a plasma 216 may be ignited either in first plasma generation chamber 215, and/or a plasma 230 may be ignited in workpiece processing region 233, for example to produce plasma products from a fluorine-containing source gas or other source gas for etching. For example, while source gases are supplied, an AC voltage, typically in the radio frequency (RF) range, may be generated by power supply 240 and applied between the conductive top portion of the processing chamber, such as faceplate 217, and showerhead 225 and/or ion suppressor 223 to ignite plasma 216 in first plasma generation chamber 215. Similarly, with source gases (and/or plasma products from first plasma generation chamber 215) flowing, an AC voltage may be applied between showerhead 225 and pedestal 265 to ignite plasma 230 in processing region 233. Power supply 240 may operate at an RF frequency of 13.56 MHz but may also operate at other frequencies, alone or in combination with the 13.56 MHz frequency.

Certain plasma processing applications and/or workpieces such as wafers advantageously allow charged species (e.g., ions and free electrons) within plasma products to come freely into contact with a workpiece, while other applications or workpieces advantageously reduce or isolate charged species from the workpiece. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials. For example, to reduce or isolate the charged species, a plasma may generate plasma products in a region that is upstream of a process chamber. The plasma is contained to the region where it is generated, and charged species are encouraged to neutralize and/or combine with one another, but neutral species such as uncharged molecular fragments, free atoms and excited but neutral radicals are allowed to pass through to the process chamber.

Figure 3:
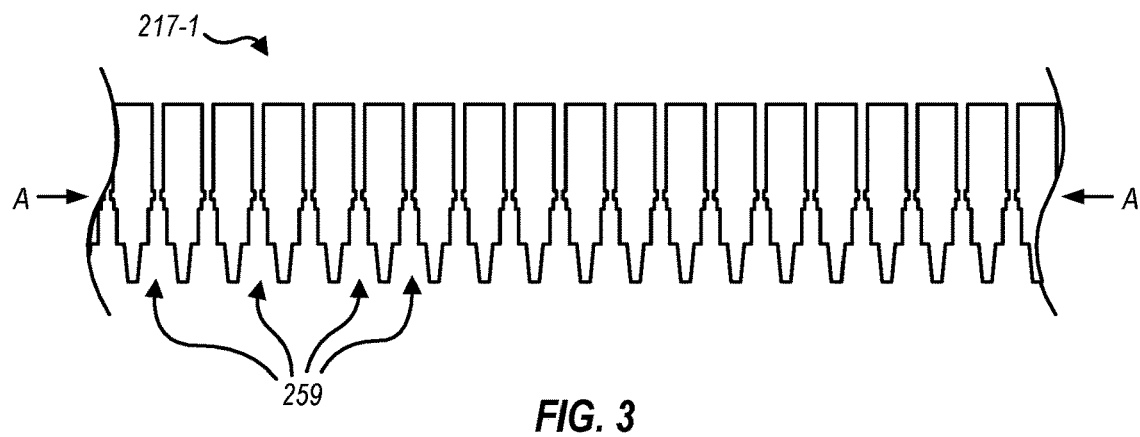
FIG. 3 schematically illustrates a portion of a faceplate that forms multiple apertures, according to one or more embodiments.

One way to contain plasma and exclude charged species from particular regions of a plasma processing system is to use an electrode that forms apertures through which neutral species and radicals can pass, but which inhibits passage of ions and/or free electrons, and through which the electric fields that generate the plasma are reduced. For example, FIG. 3 schematically illustrates a portion of a faceplate 217-1 (e.g., an example of faceplate 217, FIG. 2) that forms multiple apertures 259. The general concept of using aperture widths to selectively contain or allow passage of ionic species and/or free electrons is now discussed using faceplate 217-1 as an example. However, it should be clear that the principles taught can pertain to other parts of a plasma processing system where a plasma is generated in one location and transmitted through an electrode to another location, or where a plasma is generated in a location of intended use and apertures are used to limit backstreaming of ionic species and free electrons to unintended locations.

Each aperture 259 forms a narrow passageway about halfway through faceplate 217-1 between points A-A, as shown. The width of apertures 259 between points A-A can be such that the electromagnetic power that generates and/or sustains the plasma above faceplate 217-1 (e.g., in first plasma generation chamber 215, FIG. 2) is strongly attenuated within apertures 259, and ionic species and free electrons are forced through collisions and other wall effects to recombine and/or neutralize one another. A width of apertures 259 that will limit passage of ionic species and free electrons is related to the Debye length of the plasma, and can be calculated based on factors such as a wavelength of the electromagnetic power generating the plasma, the gas species from which the plasma is formed, and pressure of the plasma. It should also be noted that complete segregation of ionically charged species may not be desired in all embodiments. For example, in certain instances, some ionic species are intended to reach a processing region in order to perform an etch and/or deposition process. In these instances, apertures 259 of electrodes such as faceplate 217-1 may be sized so as to merely reduce, but not eliminate, ionic species in the processing region. Other factors may also influence an optimum width of apertures 259, such as material properties of faceplate 217-1 and/or coatings thereon. Thus, determination of width of apertures 259 for a given type of plasma system is usually determined empirically. An adjustable electrical bias may also be applied to faceplate 217-1 as an additional means to control the flow of ionic species through the faceplate.

It should be understood that apertures 259 are formed in faceplate 217-1 across an entire working area of the faceplate (e.g., working area 251, FIG. 2) and that a distance between faceplate 217-1 (or any other electrode herein having numerous apertures for plasma products to pass through) and workpiece 255 is great enough, as compared with spacing of apertures 259, for the plasma products to mix uniformly by the time they reach workpiece 255.

By using apertures 259 with narrow passageways, a process chamber may be configured to inhibit plasma, free electrons and/or ionic species from contact with a workpiece being processed. This may advantageously protect a variety of intricate structures and films patterned on the substrate, which could be warped, dislocated, or otherwise damaged if directly contacted by a plasma. Additionally, when plasma is allowed to contact or approach the workpiece, the rate at which oxide species etch may increase. Accordingly, if an exposed region of material is oxide, the material may be further protected by maintaining the plasma remotely from the substrate.

The principle of utilizing small apertures to contain plasma and suppress the flow of charged species can be applied to any electrode such as faceplate 217, ion suppressor 223 and/or showerhead 225, between a plasma generation region and a processing region, or between plasma generated in a processing region, and upstream regions. However, use of this principle can result in certain costs and constraints. Apertures 259 are generally formed by drilling in order to control the narrow passageway widths, and many such apertures are typically needed to provide enough plasma product throughput to maintain process reaction rates (e.g., etch or deposition rates) high enough for satisfactory workpiece throughput. Apertures 259 must also be very consistent in size, because process deviations may occur if certain spatial regions of an electrode have apertures 259 that are narrower or wider than in other spatial regions. To meet these needs, drilling alone can amount to thousands of dollars of labor and/or equipment time invested per electrode.

It is also very difficult to coat narrow apertures 259 uniformly with protective coatings (for example, yttria or alumina) to protect the electrode through which the apertures are formed. The high aspect ratio of apertures 259, particularly in the narrowest regions, tends to cause nonuniform coating thickness, and limits coating thicknesses that can be applied, because most coating techniques are directional. That is, the coating material tends to stick to the first object that it encounters. Typical coating techniques for applying yttria or alumina on aluminum parts include plasma spraying and atomic layer deposition. Plasma spraying is moderately precise and moderately expensive, while atomic layer deposition is extremely precise and extremely expensive; both techniques are at least somewhat directional. Thus, with either technique, coating tends to build up readily on flat plates, and much slower within passageways that are substantially parallel with the direction along which the coating material travels during deposition. Atomic layer deposition provides good control over thickness, even within apertures 259, but plasma spraying that is sufficient to coat far within apertures 259 can build up at the outer edges of the apertures, resulting in size variation among the apertures.

Still furthermore, when the area of an electrode that permits passage of plasma products is constricted by forming very small apertures therethrough, the flow of the plasma products is necessarily reduced, which slows down the desired processes such as deposition and etching. Additionally, once apertures 259 of the size and number required are formed, they cannot be readily changed; if a different aperture size is required to support a different process or a desired change of process parameters, an entire electrode must be removed and replaced with a different one. Opening up a process chamber is generally undesirable in plasma processing equipment, because electrode surfaces are generally exposed only to tightly controlled conditions and/or substances during use; opening the chamber to atmosphere usually disrupts chamber surface conditioning, resulting in a need to recondition the surfaces and test chamber performance before production processing is allowed to resume.

Certain embodiments herein provide plasma containment and ion suppression by utilizing a plurality of electrodes with apertures therethrough, wherein the apertures can be of almost any size, but whose alignment or misalignment with respect to one another is controlled, and wherein the electrodes are maintained in extremely close proximity to one another. In these embodiments, a gap between the electrodes can play the same role as the narrow passageways of apertures 259 described above. While this approach results in new constraints, such as needs for electrode planarity and gap distance control, most or all of the constraints noted above are mitigated or eliminated. For example, drilling costs for the electrodes can be reduced because electrode apertures can be fewer and larger; coating difficulties for the electrodes can be reduced because electrode aperture aspect ratios are decreased, and available area for throughput of plasma products can be increased. Also, through the use of appropriate mechanisms as described below, electrode gap distance and/or aperture alignment can be adjusted to provide process effects. One result of this is that gap distance and/or aperture alignment can be changed substantially, in situ, from time to time so that different processes can be performed without removing and replacing electrodes or using multiple pieces of process equipment.

Figure 4:
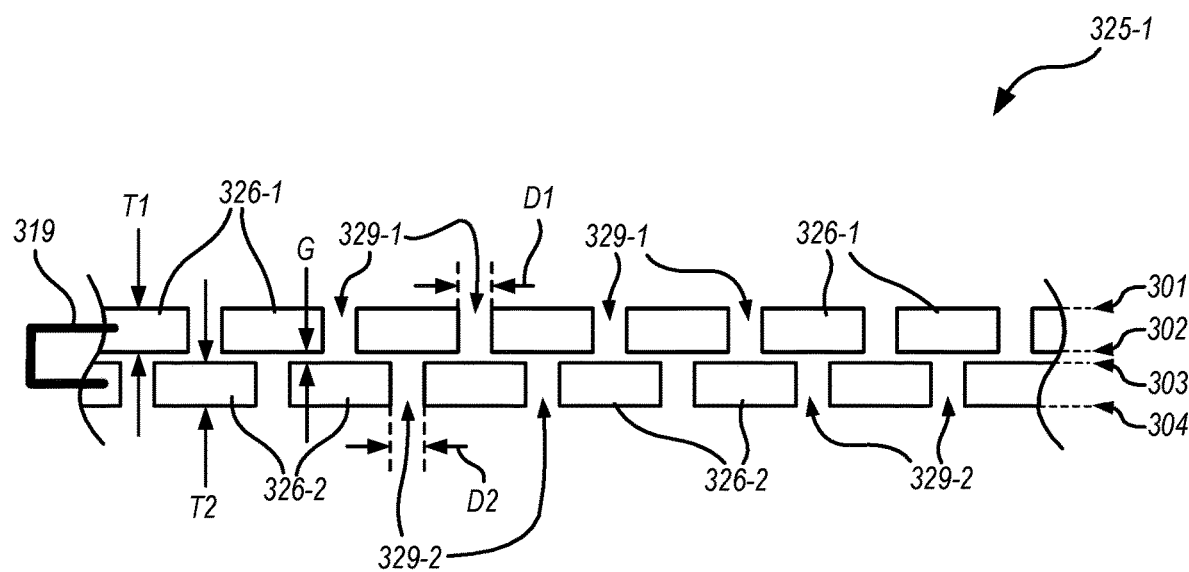
FIG. 4 schematically illustrates a portion of a two part electrode assembly, in a cross-sectional view, according to one or more embodiments.

FIG. 4 schematically illustrates a portion of a two part electrode assembly 325-1 that includes individual electrodes 326-1 and 326-2, in a cross-sectional view. The principles now described in connection with FIG. 4 can be applied, in embodiments, to any electrode or set of electrodes that separate portions of a plasma system, such as separating a plasma generation region from a process chamber and/or from other electrodes. For example, two part assembly 325-1 could take the place of ion suppressor 223 and/or showerhead 225, FIG. 2. One of ordinary skill in the art would immediately conceive of many alternatives, variations and/or equivalents, all of which are considered within the scope of this disclosure. Electrodes 326-1 and 326-2 may be fixedly coupled with one another or may be movable with respect to one another, as discussed further below. Electrodes 326-1 and 326-2 are typically held at a common electrical potential, for example by connecting them through an optional RF grounding strap 319.

Each of electrodes 326-1 and 326-2 forms many apertures 329-1, 329-2 respectively, in the illustrated plane of FIG. 4, but are continuous in other planes, such that the pieces illustrated in FIG. 4 are but parts of each electrode 326-1 and 326-2. Each aperture 329-1 has a diameter D1, and each aperture 329-2 has a diameter D2. FIG. 4 shows D1 and D2 as approximately equal, but this is not required, and it is not required that D1 or D2 be the same across all apertures of either electrode. In certain embodiments, nominally similar diameters across each electrode advantageously provide ease of layout and drilling efficiency. Electrode 326-1 defines a first planar surface 301 and a second planar surface 302 separated by an electrode thickness T1; electrode 326-2 defines a third planar surface 303 and a fourth planar surface 304 separated by an electrode thickness T2. FIG. 4 shows T1 and T2 as approximately equal, as found in certain embodiments, but this, is not required. In practice, T1 and T2 are typically chosen based on the lateral dimensions of electrodes 326-1 and 326-2 and based on the electrode material(s), such that the electrodes are mechanically stable across an intended process chamber, but advantageously not much greater than needed to ensure mechanical stability, for reduced weight and material cost. For example, in certain embodiments, T1 and T2 are about one quarter inch (e.g., 4 to 8 mm) for a plasma processing system that processes 12 inch (300 mm) nominal wafers, but in other embodiments of other sizes or having other constraints, T1 and T2 could range from 0.100 inch to about 1.00 inch (e.g., 2 to 25 mm). In certain embodiments, D1 and D2 are chosen so that an aspect ratio T/D of apertures 329-1, 329-2 is about 2:1 or less, to promote uniform application of coatings within the apertures. However, other embodiments use apertures with aspect ratios greater than 2:1, particularly when techniques such as chamfering are used to make inside walls of the apertures more accessible for application of coatings (see FIG. 5).

Apertures 329-1 and 329-2 are arranged or are at least adjustable so that no line-of-sight from above assembly 325 to below assembly 325 exists through any pair of apertures 329-1 and 329-2. Thus, when a plasma or gas exists above assembly 325, individual species such as ions, molecular fragments, individual atoms or free electrons can only pass through assembly 325 by passing first through an aperture 329-1, then between electrodes 326-1 and 326-2, then through an aperture 329-2. Electrodes 326-1 and 326-2 are separated by a gap of distance G between surfaces 302 and 303, as shown. G can be chosen so as to contain plasma and suppress the flow of charged species, from above assembly 325, to below it.

The value of gap distance G that will accomplish these objectives is a function of plasma source gas type, plasma pressure, power density applied to the plasma, and aperture-to-aperture registration. For charged species containment, gap distance G should be about, or smaller than, the minimum aperture size that would support a hollow-cathode discharge. Thus, typical values of gap distance G to contain plasma are generally on the order of 0.002 inches to 0.150 inches (e.g., about 0.05 mm to 3.81 mm). Higher pressures and power densities will promote the possibility of plasma "leakage" (e.g., passage of charged species through the two electrode assembly), other variables being equal. For example, useful upper bounds for gap distance G may be about 0.045 inch and 0.035 inch for certain source gases and power densities at 10 and 20 Torr respectively, but G could vary further for higher or lower pressures, or due to other variables. Because of all the variables involved, an upper end of gap distance G that will contain charged species may be any of 0.002 inches, 0.005 inches, 0.010 inches, 0.015 inches, 0.020 inches, 0.025 inches, 0.030 inches, 0.035 inches, 0.036 inches, 0.040 inches, 0.045 inches, 0.048 inches, 0.050 inches, 0.055 inches, 0.060 inches, 0.065 inches, 0.070 inches, 0.075 inches, 0.080 inches, 0.085 inches, 0.090 inches, 0.095 inches, 0.100 inches, 0.105 inches, 0.110 inches, 0.115 inches, 0.120 inches, 0.125 inches, 0.130 inches, 0.135 inches, 0.140 inches, 0.145 inches or 0.150 inches, or values intermediate to those listed. Lower bounds of G can be set based on known or estimated planarity variations of the electrodes, and built-in offsets for gap distance calibration purposes, such as described below. Lower bounds of G for certain embodiments are 0.005 to 0.010 inches.

In certain embodiments, electrodes 326-1 and 326-2, and thus apertures 329-1 and 329-2, are fixed with respect to one another. In other embodiments, at least one of electrodes 326-1 and 326-2 is adjustable with respect to the other, so that for at least one position with any applicable ranges of adjustment (as discussed below), a lateral distance between any aperture 329-1 and a nearest aperture 329-2 is at least two or at least three times G. By increasing the probability of charged species interacting with surfaces of at least one of electrodes 326-1 and 326-2, these lateral distances advantageously minimize any tendency for ionized species or free electrons to move from above assembly 325, through apertures 329-1 and 329-2 that are close to one another, to below assembly 325. However, a combination of small gap distance G (e.g., less than about 0.005 or 0.010 inches) and/or large lateral distances (e.g., more than three times G) may also reduce passage of neutral radicals and atomic species. Considering all of the effects, certain useful values of G to contain charged species but allow neutral species passage are:

Gap distance G between 0.005 to 0.035 inches and lateral distance between apertures at least twice gap distance G; especially for (but not limited to) plasmas operating at or around 20 Torr pressure; and Gap distance G between 0.010 to 0.045 inches and lateral distance between apertures at least twice gap distance G; especially for (but not limited to) plasmas operating at or around 10 Torr pressure.

Also, as described further below, gap distance G between electrodes 326-1 and 326-2 may be intentionally varied from a plasma-containing gap distance to a larger distance that allows plasma leakage, to tailor processing characteristics. The gap distance G can control both whether leakage exists at all, and the amount of leakage, thus providing a mechanism for controlling a ratio between neutral and charged species passing through a two electrode assembly.

Figure 5:
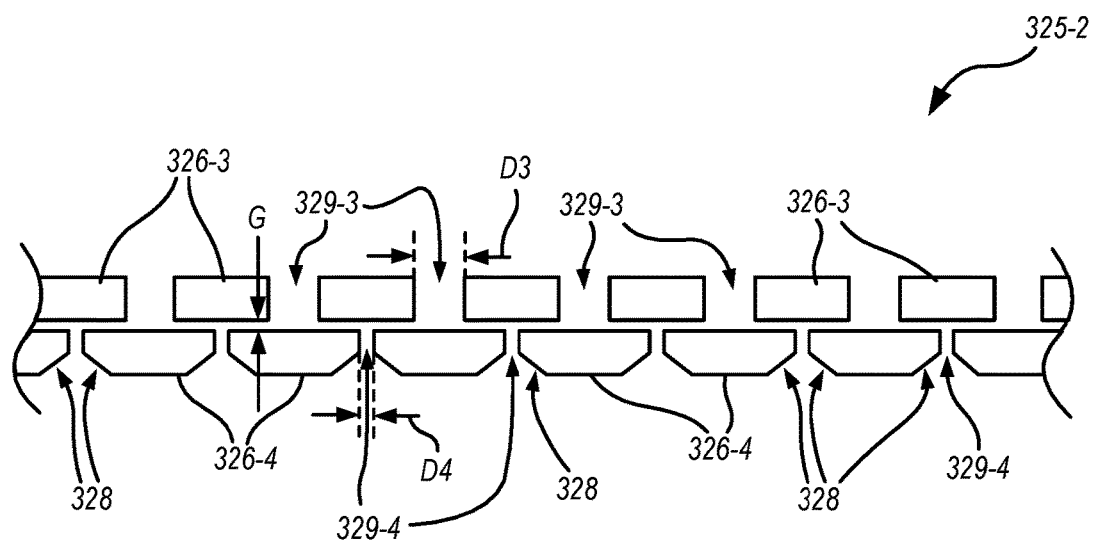
FIG. 5 schematically illustrates a portion of another two part electrode assembly, in a cross-sectional view, according to one or more embodiments.

FIG. 5 schematically illustrates a portion of another two part assembly 325-2 that includes individual electrodes 326-3 and 326-4, in a cross-sectional view. Assembly 325-2 differs from assembly 325-1 by the diameters of apertures 329-3, 329-4 through electrodes 326-3 and 326-4 respectively being different from diameters of apertures 329-1, 329-2 through electrodes 326-1 and 326-2 (FIG. 4) and by apertures 329-4 forming chamfered edges 328, as shown. Chamfered edges 328 help to improve coating uniformity within apertures 329-4 when diameter D4 is substantially smaller than a thickness of electrode 326-4, resulting in a high aspect ratio.

In certain embodiments, electrodes 326 are coupled fixedly with respect to one another and/or other plasma chamber components. These embodiments can be both less expensive to manufacture, and more durable, than systems with electrodes having very small apertures for ion and free electron control. The reduced cost is due to reduced drilling cost and reduced coating cost, while the durability can be improved by applying thicker coatings using plasma spraying, as opposed to atomic layer deposition. Electrodes 326 can also support higher plasma processing rates, because they provide freer passage of desired (neutral) plasma products, while blocking the components that are less desirable for certain processes, such as ions and free electrons.

Figure 6A:
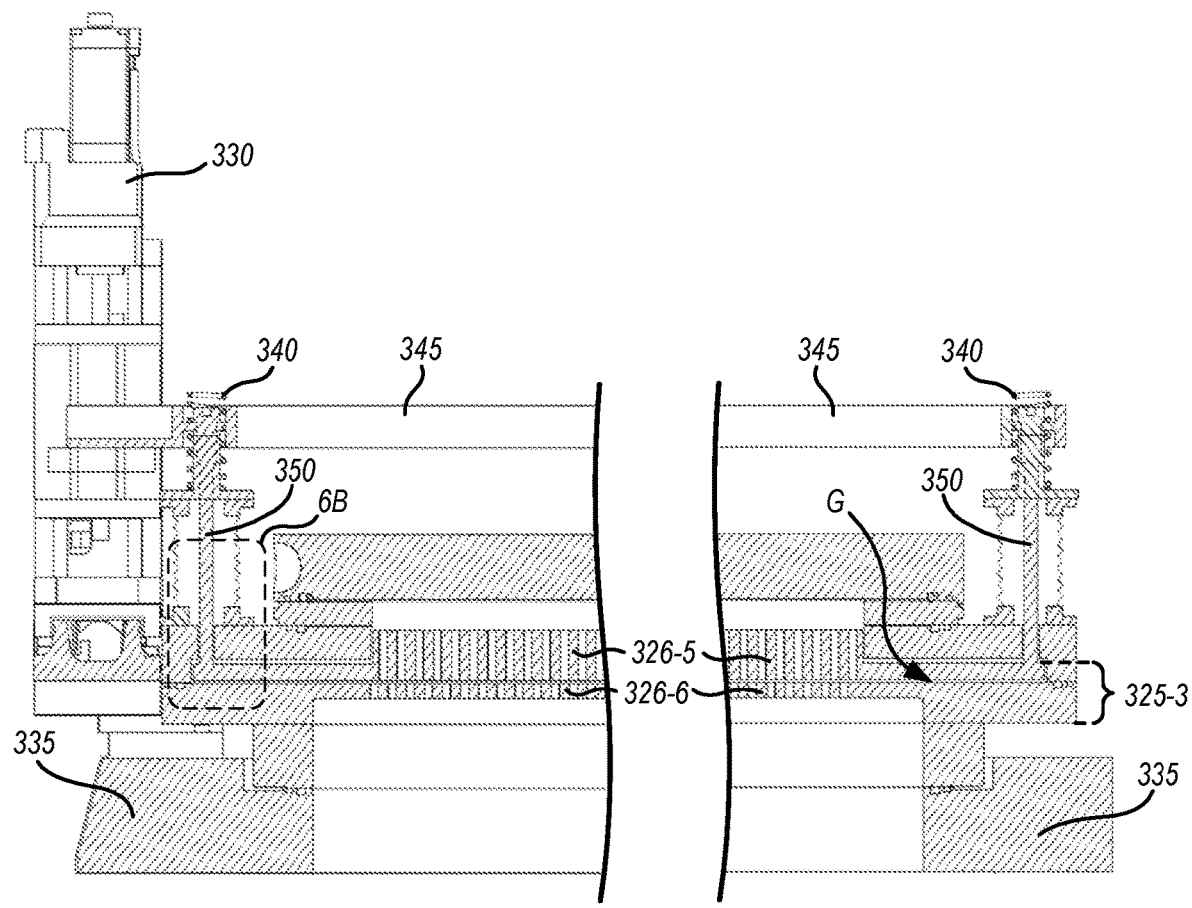
FIG. 6A schematically illustrates a two part electrode assembly that includes two electrodes and an adjustable coupler, in a cross-sectional view, according to one or more embodiments.

FIG. 6A schematically illustrates a two part electrode assembly 325-3 that includes two electrodes 326-5 and 326-6 and an adjustable coupler, in a cross-sectional view. FIG. 6A is shown in two portions with a break in between, to allow features on either side to be shown in greater detail. A portion within FIG. 6A identified as 6B is enlarged in FIG. 6B.

In FIG. 6A, the adjustable coupler is a height actuator 330, which is operable through electronic input to adjust gap G between electrodes 326-5 and 326-6. As used herein, "actuators" refer to adjustable couplers that can move or reposition one object with respect to another in response to electronic input, while other adjustable couplers may be adjusted manually or with hand tools. A support portion 335 provides a mechanical reference and support for assembly 325-3; lower electrode 326-6 is coupled fixedly with support portion 335. Support portion 335 is, for example, a base or a housing of a plasma processing system. Upper electrode 326-5 couples both with height actuator 330 and with a suspension mechanism 340. Suspension mechanism 340 is represented by coil springs in FIG. 6A, although other suspension mechanisms are possible, such as for example leaf springs, or pneumatic systems. In the illustrated embodiment, suspension mechanism 340 transfers at least most of the weight of upper electrode 326-5 to support portion 335, to reduce mechanical demands on height actuator 330, and to possibly improve precision of height control provided by height actuator 330. Suspension mechanism 340 is optional, however, and is not included in certain embodiments.

Height actuator 330 is operable to adjust gap G between surface 302 of electrode 326-5 and surface 303 of 326-6. Height actuator 330 is a stepper motor in embodiments, although other height actuators may be used, such as other types of motors, solenoids, piezoelectric actuators and the like. Stepper motors are advantageous height actuators because they can be controlled electronically and can provide fine height control in response to such control. In the embodiment illustrated in FIG. 6A, height actuator 330 couples with a ring 345 (see also FIGS. 7, 8) that connects, via rods 350, to upper electrode 326-5.

Other members and/or mechanisms may be used to couple an actuator with an electrode. Similarly, an upper electrode of a two piece electrode assembly may be fixed (e.g., to a base or housing) while the lower electrode is adjustable. One of ordinary skill in the art would immediately conceive of many alternatives, variations and/or equivalents, all of which are considered within the scope of this disclosure.

Figure 6B:
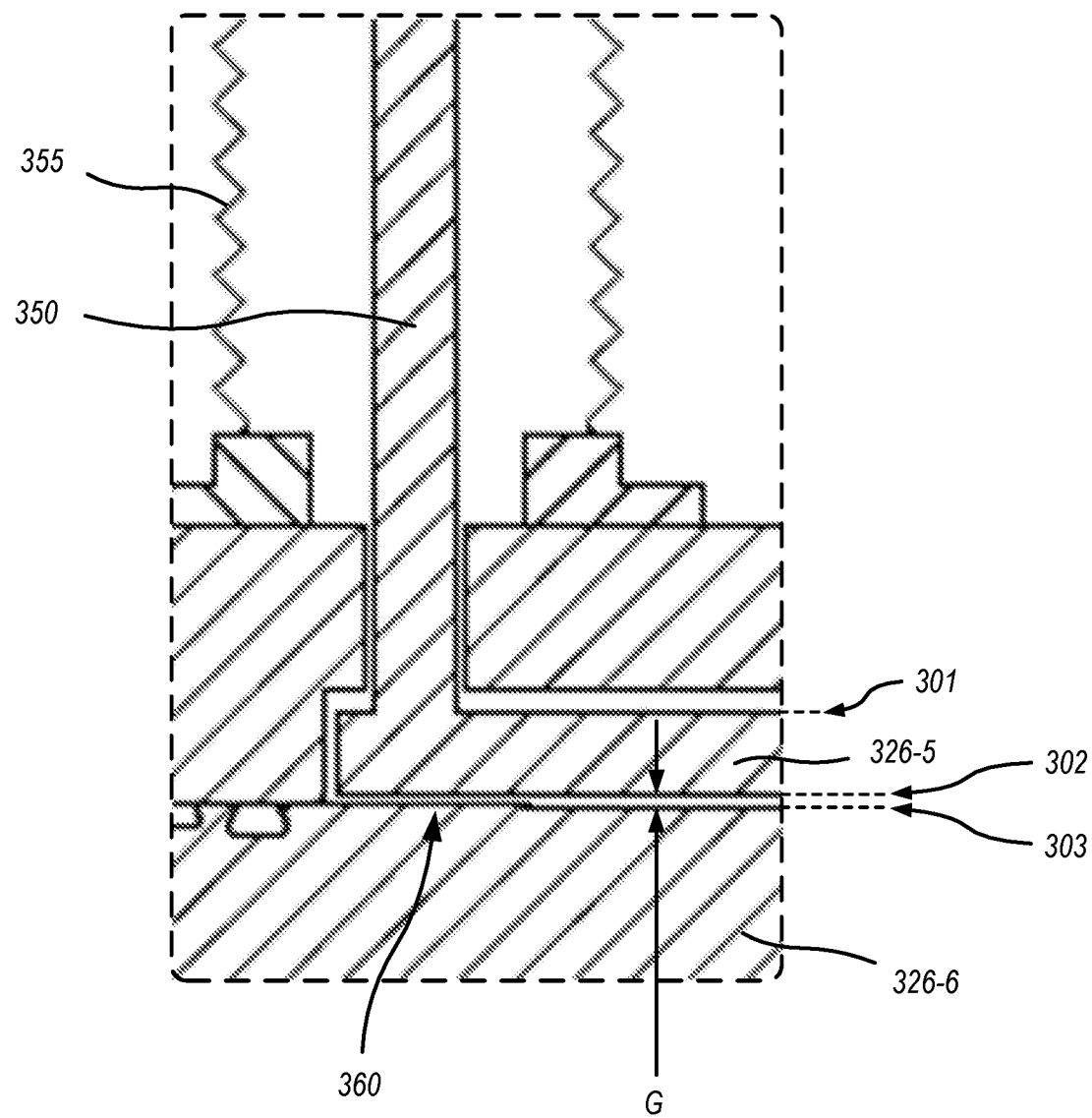
FIG. 6B schematically illustrates a portion noted within FIG. 6A, in an enlarged view, according to one or more embodiments.

FIG. 6B schematically illustrates the portion within FIG. 6A noted as 6B, in an enlarged view. As shown in FIG. 6A, rod 350 connects with upper electrode 326-5, this enables height actuator 330 to adjust gap G. Lower electrode 326-6 includes an optional region 360 that forms a slight protrusion with respect to surface 303. This allows region 360 to be used as a mechanical stop to establish a zero position or height reference between electrodes 326-5 and 326-6 without bringing surfaces 302 and 303 into direct contact with one another. In one way of establishing a height reference, height actuator 330 can be operated until surface 302 is in contact with region 360, and a position of height actuator 330 when surface 302 is in contact with region 360 can be designated the zero position or reference height for height actuator 330. For example, a controller can provide electronic input to a stepper motor acting as height actuator 330 until surface 302 is in contact with region 360, the electronic input can be released with the electrodes in contact, the electronic input can be reestablished at the position of contact, and height adjustments can be made by backing off the stepper motor by a known number of steps. Alternatively, an electronic input value that brings the electrodes into contact can be stored as a zero value, and height adjustments can be made by varying the electronic input relative to the stored value. Thereafter, since the distance response of the stepper motor to a given number of steps is known, height actuator 330 can be operated so as to increase gap G by a known amount with respect to the reference height. Using region 360 to establish contact between first and second electrodes 326-5, 326-6 in this manner allows calibration of gap G while avoiding face-to-face contact of surfaces 302 and 303. This, in turn, minimizes the chance of accidental damage resulting from contact between surfaces 302 and 303, or at least moves the point of contact away from the center of electrodes 326-5 and 326-6, where any damage is more likely to affect workpiece (e.g., wafer) processing. A height of region 360 relative to its adjacent surface (e.g., surface 303 in FIG. 6B) is advantageously greater than anticipated planarity variations of surfaces 302 and 303, but less than a height that would begin to allow ionized species through a gap formed between surfaces 302 and 303 when region 360 contacts the opposing surface. In certain embodiments, a height of region 360 relative to its adjacent surface is 0.005 inch or less, with estimated planarity variations of surfaces 302 and 303 (combined) being about 0.004 inch, and an estimated gap distance above which ionized species could begin to leak through the gap being about 0.010 inch. Although region 360 is shown as a protrusion with respect to surface 303, it is understood that region 360 could be implemented as a protrusion with respect to surface 302, or protrusions with respect to both surfaces 302 and 303. FIG. 6B also illustrates a bellows 355 that surrounds rod 350; bellows 355 isolates rod 350 and its surrounding mechanical features from adjacent areas in order to exclude any particles or debris generated by moving parts associated with actuator 330, suspension mechanism 340 and the like.

Figure 7:
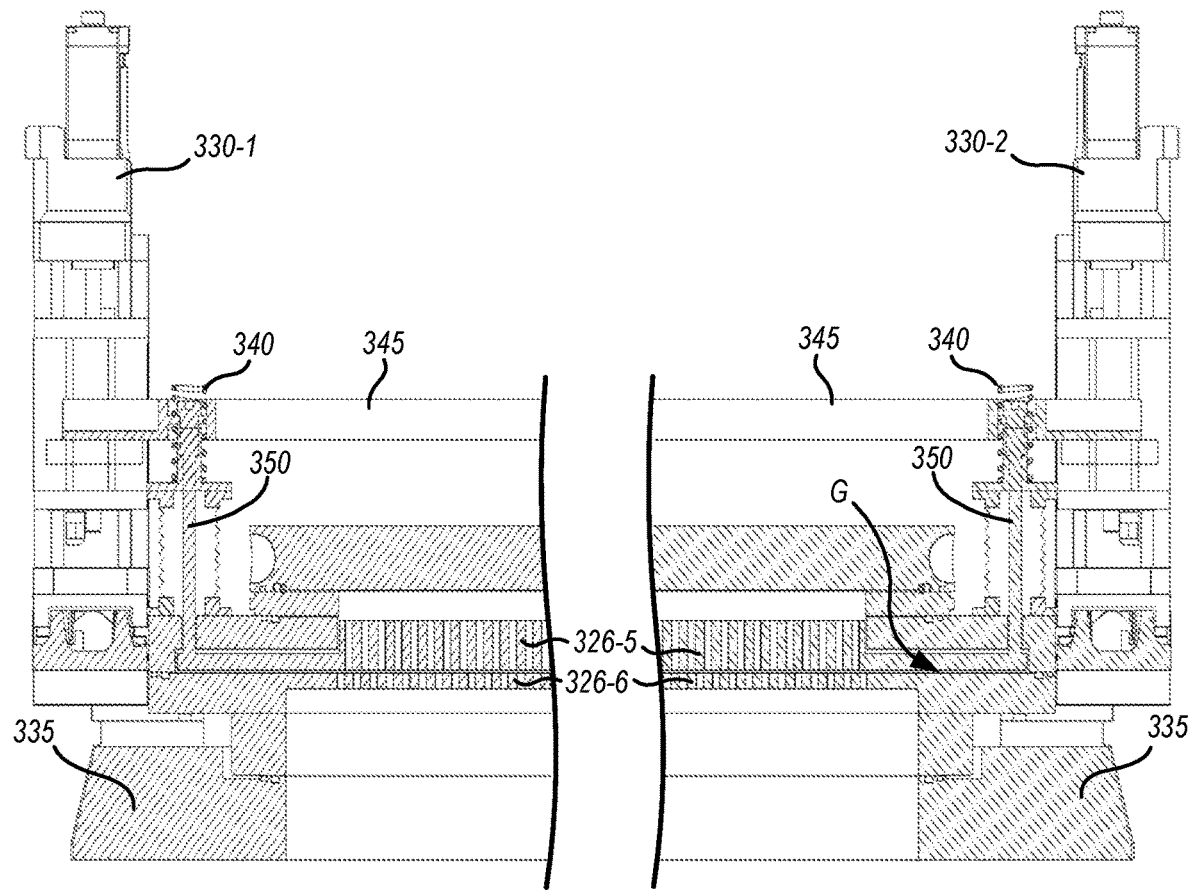
FIG. 7 schematically illustrates a two piece electrode assembly with two actuators for adjusting vertical position of one electrode with respect to another electrode, in a cross-sectional view, according to one or more embodiments.

FIG. 7 schematically illustrates a two piece electrode assembly with two actuators for adjusting vertical position of one electrode with respect to another electrode, in a cross-sectional view. The assembly shown in FIG. 7 is the same as that shown in FIGS. 6A and 6B, except that two height actuators 330-1 and 330-2 adjust height of ring 345, connected with lower electrode 326-6, at different locations around a circumference of ring 345. In this embodiment, coupling points between height actuators 330-1 and 330-2, and ring 345 and/or support portion 335, are nonrigid so that a mechanical system thus formed is not overconstrained, that is, one or both coupling points may form angles necessary for ring 345 to be at one height at height actuator 330-1, and another height at height actuator 330-2, relative to support portion 335. By providing height adjustment at two points around ring 345, gap G can be adjusted to be greater on one side than the other, forming a tilt. The azimuthal tilt axis between electrodes 326-5 and 326-6 (e.g., a direction from one peripheral point where gap G is greatest, to another peripheral point where gap G is smallest) would align with the coupling points of ring 345 with electrodes 326-5 and 326-6. Mechanical stops (e.g., protrusions like protrusion 360, FIG. 6B) can be provided adjacent to each height actuator 330-1, 330-2 so that reference heights for actuators 330-1, 330-2 can be set independently of one another.

Figure 8:
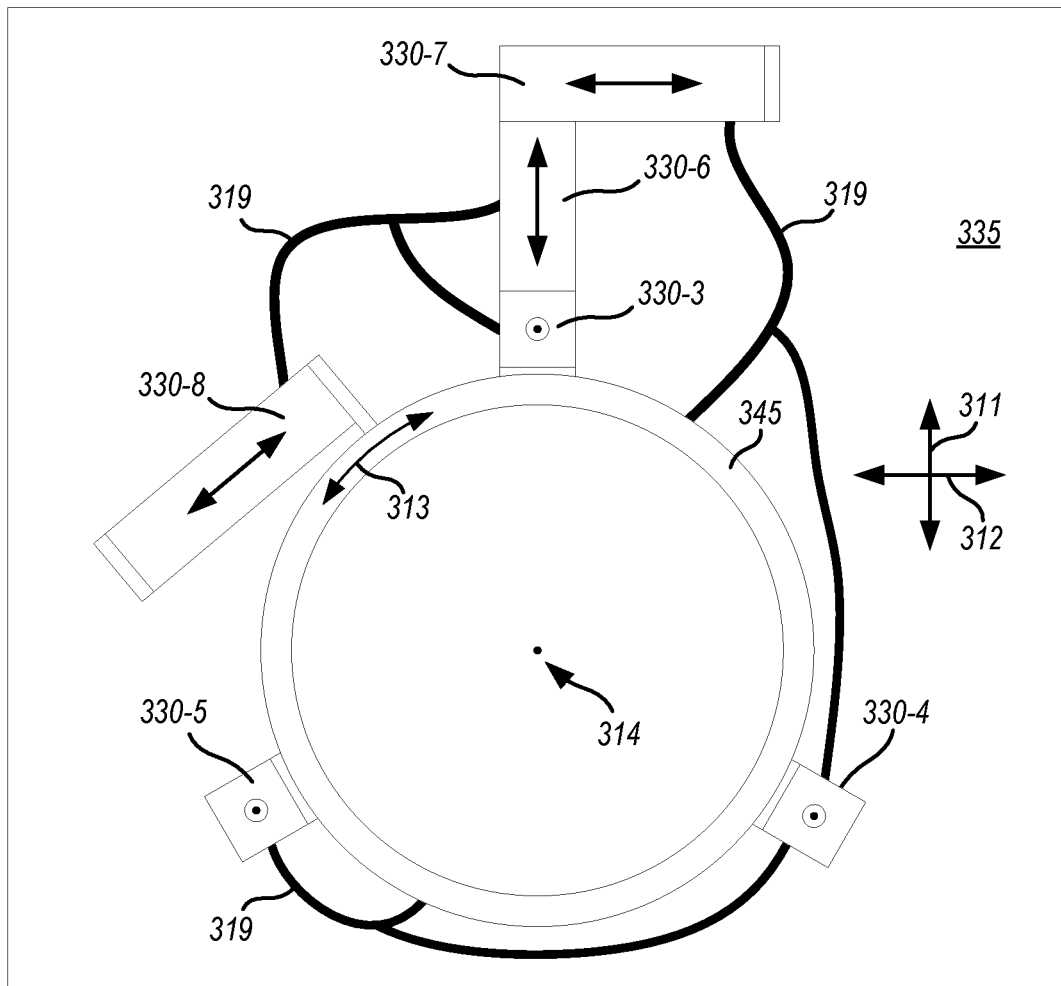
FIG. 8 schematically illustrates an assembly with six actuators for adjusting position of a ring with respect to an underlying support portion, in a plan view, according to one or more embodiments.

One skilled in the art can see that a further extension of the approach illustrated in FIG. 7, but including three actuators with coupling points spaced around ring 345, could set an azimuthal tilt axis of a gap thus formed to any direction, by coordinating height of all three height actuators. Also, actuators that control lateral position of electrodes are also possible. FIG. 8 schematically illustrates an assembly with six actuators for adjusting lateral and vertical positions of a ring 345 with respect to a support portion 335, in a plan view. Support portion 335 is for example a base or a housing of a plasma processing system, such as shown in FIGS. 6A and 7. In FIG. 8, a vertical direction, shown in FIGS. 2-7 as vertical in the drawings, is in and out of the page, while directions 311 and 312 are horizontal directions.

Ring 345 can be used to position one electrode of a two piece electrode assembly, where the other electrode of the two piece electrode assembly is fixedly coupled with support portion 335. An underside of ring 345 couples with one of the two electrodes, which are hidden by ring 345 and other structures in the plan view of FIG. 8. Three height actuators 330-3, 330-4 and 330-5 couple with ring 345 so that a gap G between the two electrodes can be adjusted and so that the gap can be formed along any desired azimuthal tilt angle. Coupling points between height actuators 330-3, 330-4 and 330-5 and ring 345 and/or support portion 335, are nonrigid so that a mechanical system thus formed is not overconstrained. Although FIG. 8 shows height actuators 330-3, 330-4 and 330-5 and ring 345 as spaced approximately equidistant around ring 345, it is understood that equal spacing is not required. As discussed above, various embodiments may include only one, two, or all three of height actuators 330-3, 330-4 and 330-5, and height actuators 330-3, 330-4 and 330-5 can all be considered examples of adjustable couplers that could also be operated manually or using hand tools.

A first horizontal actuator 330-6 and a second horizontal actuator 330-7 are operable to position height actuator 330-3 and ring 345 in different horizontal directions relative to support portion 335. A third horizontal actuator 330-8 is operable to position ring 345 rotationally with respect to support portion 335. Coupling points between horizontal actuators 330-6, 330-7 and 330-8 and ring 345 and/or support portion 335, are also nonrigid so that a mechanical system thus formed is not overconstrained (e.g., the combined actions of height actuators 330-6, 330-7 and 330-8 do not twist or deform ring 345). Various embodiments may include only one, two, or all three of horizontal actuators 330-6, 330-7 and 330-8, and horizontal actuators 330-6, 330-7 and 330-8 can all be considered examples of adjustable couplers that could also be operated manually or using hand tools. Any or all of height actuators 330-3, 330-4 and 330-5, horizontal actuators 330-6, 330-7 and 330-8, ring 345 support portion 335 and/or electrodes positioned thereby may be held at a common electrical potential by connecting them through optional RF grounding straps 319, as illustrated in FIG. 8. Also, mechanical stops may be used to set reference values for each of horizontal actuators 330-6, 330-7 and 330-8 (e.g., in the same manner as region 360 can be used to set a reference value for height actuator 330; see FIG. 6B).

Thus, horizontal actuators 330-6, 330-7 and 330-8 are collectively capable of positioning ring 345 and an electrode that ring 345 couples with, along any of horizontal directions 311 and 312, and rotational direction 313 relative to a central axis 314 of ring 345, as shown, within an adjustment range of each of horizontal actuators 330-6, 330-7 and 330-8.

The ability to control both lateral and vertical spacing of electrodes in a plasma processing system provides advantages not previously available in such systems. First, effects of height actuators 330-1, 330-2 and/or 330-3 are considered. When the overall gap distance is sufficiently small, a lateral spacing of about three times the gap distance is believed sufficient to ensure neutralization of free electrons and ions, given that there may be a small subset of free electrons and/or ions that find their way from one aperture, through the gap and to another aperture, through collisions. When gap spacing is large, free electrons and/or ions will move through freely. An exact distance sufficient to allow free passage of free electrons and/or ions is related to an effective Debye length of the applicable plasma, but for practical purposes this distance is determined by process characterization. One height actuator 330 is sufficient to adjust the gap distance G globally; two height actuators 330 enable the gap distance to be tilted along one azimuthal direction (defined by a line between attachment points of the actuators with the movable electrode); and three height actuators 330 enable a tilt to be worked into the gap distance along any azimuthal direction. This can be used to shift processing from domination by neutral species chemistry to ionic chemistry and vice versa, and can provide a process control bias from one side of the system to the other.

Next, effects of horizontal actuators 330-6, 330-7 and 330-8 are considered. In certain embodiments, adjustment ranges of one or more of horizontal actuators 330-6, 330-7 and 330-8 are sufficient to move apertures 329 of electrodes 326 relative to one another, sufficiently to modify the ability of the two piece electrode apparatus to permit or inhibit throughput of certain plasma products. That is, within the adjustment ranges of horizontal actuators 330-6, 330-7 and/or 330-8, certain positions may correspond to apertures 329 being out of alignment, so that no apertures 329 in one of the electrodes 326 align with any of apertures 329 in the other electrode 326, to form an open straight-line path extending through both of the electrodes. Adjusted in this manner, free electrons and ionic species tend to contact, and be neutralized by, one or the other of electrodes 326. In addition to not forming an open straight-line path, these positions may meet the condition that apertures 329 in one of the electrodes 326 are laterally positioned at least three times the local gap distance from apertures 329 in the other electrode 326. That is, adjacent to each aperture 329 in one electrode, the gap is bounded by electrode material, not an aperture, for least three times the gap distance from any aperture 329 in the other electrode 326, measured laterally in any direction.

When two electrodes are provided with similar aperture layouts, translation of one electrode relative to another can bring apertures 329 on one electrode into, or out of, horizontal proximity or alignment with apertures 329 on the other electrode, all at the same time. Bringing all of the apertures into alignment at the same time (e.g., see FIGS. 9C, 10B) allows selective admittance or inhibition of free electrons and/or ions across the entire working area of a processing system (e.g., working area 251 of plasma processing system 200, FIG. 2). Rotation of one electrode with respect to the other can cause very different effects. Radially symmetric layouts can, when one electrode is rotated relative to another, cause apertures far away from the center of rotation to come into alignment (e.g., see FIG. 12) with areas where the apertures are aligned moving closer to the center for as rotation is increased. This can be utilized to modify processing by creating process effects related to radial position within the working area. Layouts with different (e.g., non-radial) symmetry can generate other patterns of overlap or non-overlap of aperture areas. All such patterns can be used to provide degrees of process control by regulating throughput of free electrons and/or ions relative to throughput of unionized plasma species, across the two piece electrode assembly. The possible variations of such throughput regulation are thought to be more diverse than achievable with previous electrode assemblies; some such variations, and how they are achieved, are discussed in detail below.

Figure 9A:
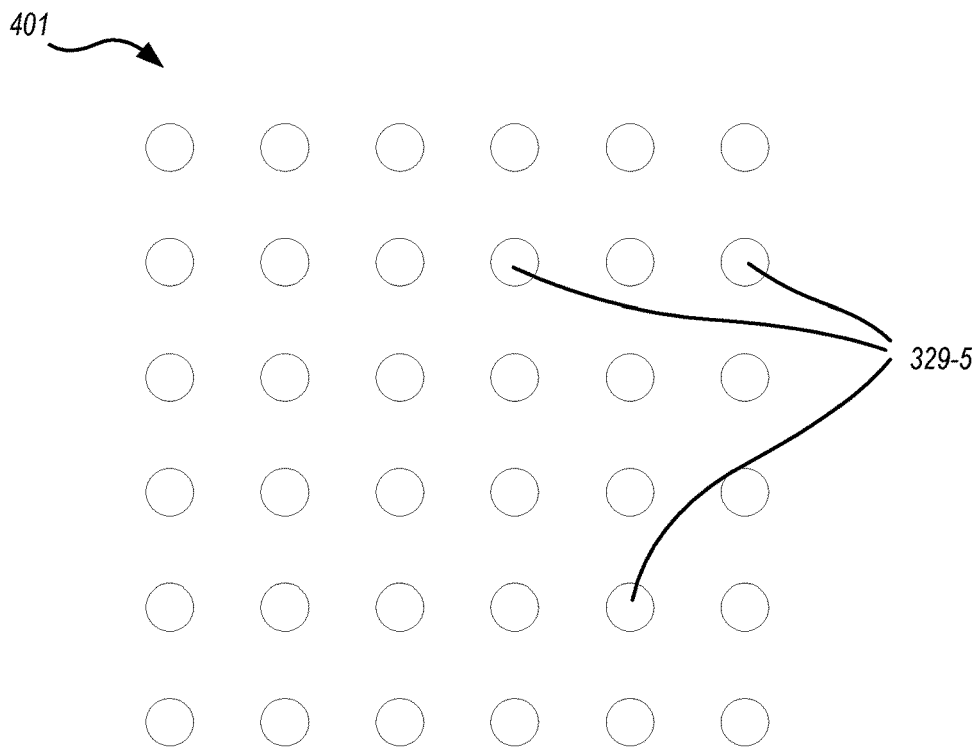
FIG. 9A schematically illustrates a layout of apertures that could be formed in an electrode of a two piece electrode assembly, in a plan view, according to one or more embodiments.
Figure 9B:
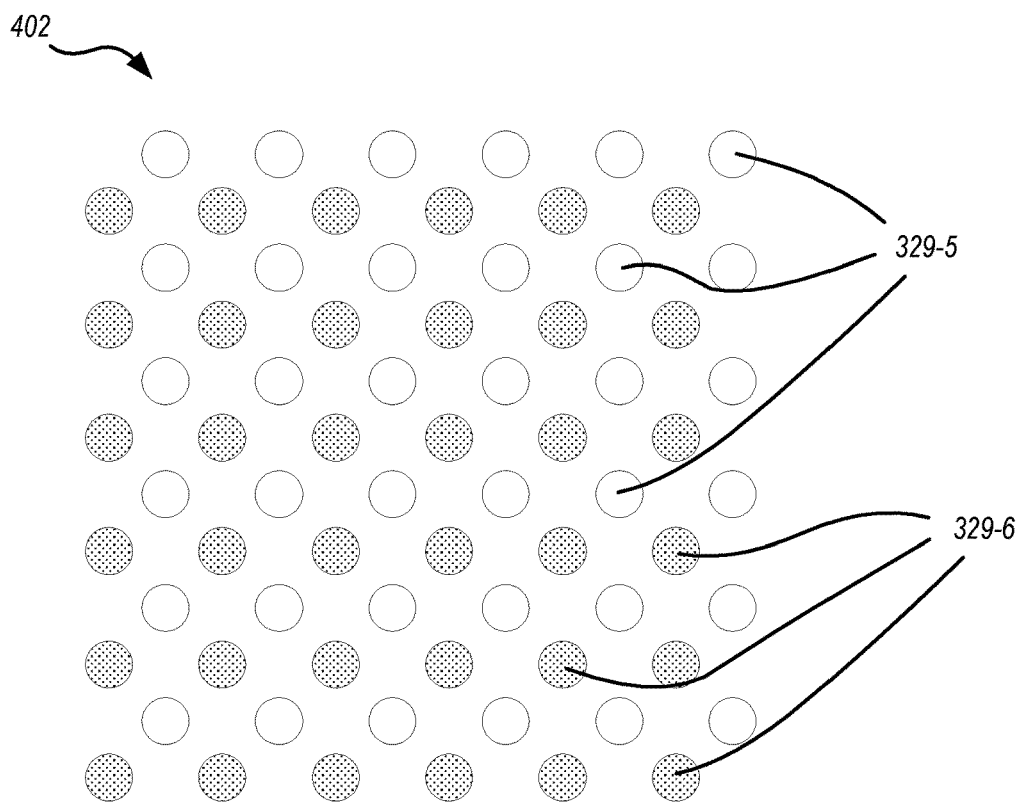
FIG. 9B schematically illustrates a layout that includes the apertures illustrated in FIG. 9A, and apertures of a second electrode, also in a rectangular arrangement, in a plan view, according to one or more embodiments.

FIG. 9A schematically illustrates a layout 401 of apertures 329-5 that could be formed in an electrode of a two piece electrode assembly, in a plan view. Apertures 329-5 are not drawn to any particular scale, but are uniform in size and layout with respect to one another, as illustrated. Layout 401 is a rectangular arrangement; it should be understood that layout 401 could be continued throughout a working area of an electrode (e.g., see working area 251, FIG. 2). FIG. 9B schematically illustrates a layout 402 that includes apertures 329-5 as in layout 401, and apertures 329-6 of a second electrode, also in a rectangular arrangement, and interspersed with apertures 329-5. Apertures 329-6 are also not drawn to any particular scale but are uniform in size and layout with respect to one another and with respect to apertures 329-5, as illustrated. Apertures 329-5 could be formed within an upper of two electrodes with apertures 329-6 formed within a lower of the two electrodes, or vice versa. Like faceplate 217-1 discussed above (FIG. 2), it should be understood that apertures 329-6 in layout 402 could be continued across an entire working area of an electrode. Also like faceplate 217-1, a distance between the electrodes that form apertures 329-5 and 329-6 and a workpiece to be processed is great enough, as compared with spacing of apertures 329-5 and 329-6, for plasma products to mix uniformly by the time they reach the substrate.

Figure 9C:
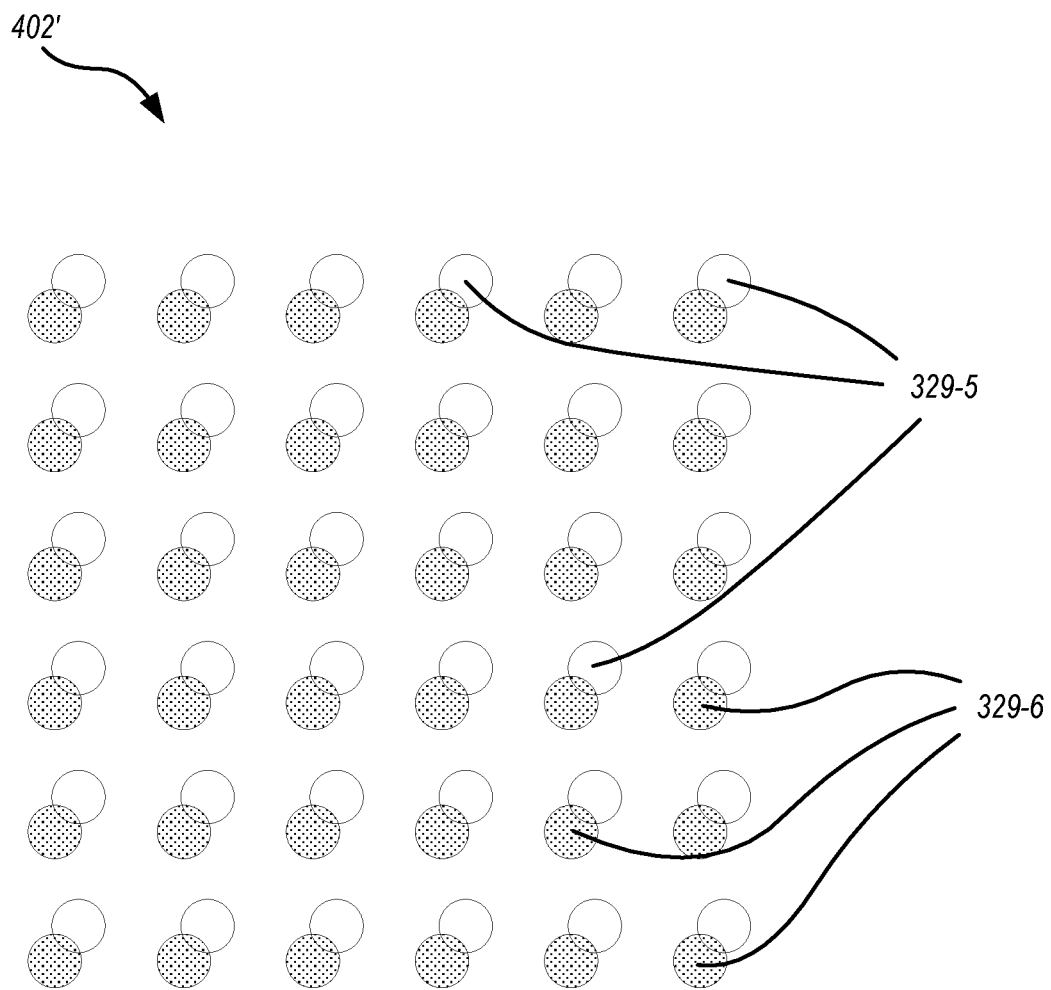
FIG. 9C schematically illustrates a layout that includes the apertures illustrated in FIGS. 9A and 9B, with one of the sets of apertures shifted, in a plan view, according to one or more embodiments.

FIG. 9C schematically illustrates layout 402' that includes apertures 329-5 laid out in the same arrangement relative to one another as in layouts 401 and 402, and apertures 329-6 laid out in the same arrangement relative to one another as in layout 402. However, in layout 402', all apertures 329-6 are shifted relative to apertures 329-5, as would occur if one electrode forming apertures 329-6 were shifted laterally relative to another electrode forming apertures 329-5 (e.g., using horizontal actuators 330-6 and 330-7, FIG. 8). In FIG. 9C, it can be seen that each aperture 329-5 overlaps a corresponding aperture 329-6 by the same amount as each other aperture 329-5 overlaps a corresponding aperture 329-6. This illustrates that when two electrodes have apertures in identical arrangements, shifting one electrode laterally relative to the other electrode can be utilized to bring apertures into alignment across an entire working area of the electrode simultaneously. Because each overlapping pair of apertures 329-5, 329-6 is at the same spacing as either of apertures 329-5 and/or 329-6, plasma products such as free electrons or ions can pass at locations that are at the same spacing as the apertures themselves. Thus, the ionized plasma products can mix uniformly by the time they reach a workpiece being processed. The ability to move one electrode relative to another, and to use a gap between the electrodes to prevent ionized plasma products from moving through except where apertures overlap, creates the ability to selectively gate the ionized plasma products, without changing plasma generation conditions and without changing out electrodes to replace small diameter apertures with larger apertures.

Other layout strategies for apertures on two electrodes are possible and certain design tradeoffs are possible. For example, each of apertures 329-5 and 329-6 in layout 402 is relatively sparse in the sense that each electrode that forms the apertures is mostly solid, with only about 14% of the surface area removed to form apertures. This may allow for fine control of aperture overlap (e.g., relatively large electrode motions required to make apertures overlap, and relatively small increase of overlap area with further motion) but may reduce overall throughput of unionized species due to the low aperture area. The same layout, but using larger apertures, would increase overall throughput of unionized species but may decrease control of aperture overlap (e.g., relatively small electrode motions required to make apertures overlap, and relatively quick increase of overlap area with further motion).

Figure 10A:
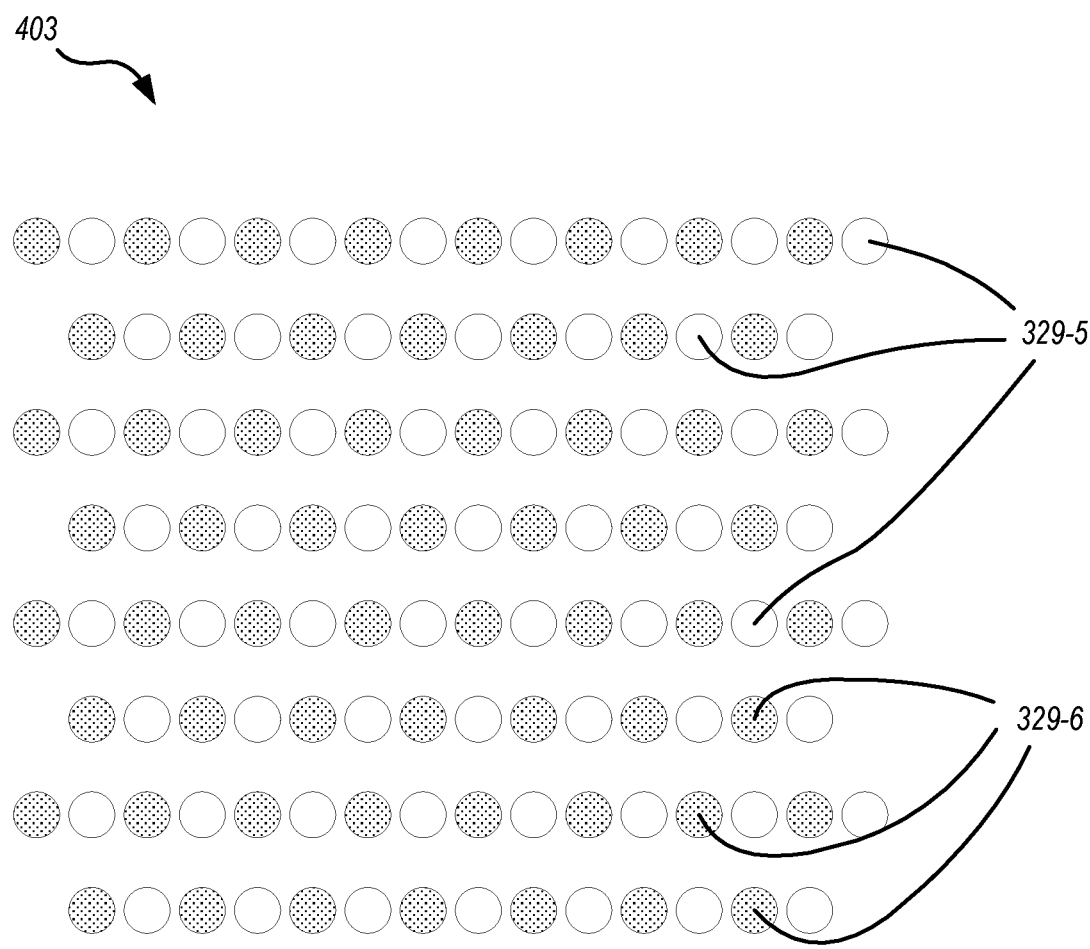
FIG. 10A schematically illustrates a layout of apertures in hexagonal arrangements that can be formed in each of an upper and a lower electrode, in a plan view, according to one or more embodiments.

FIG. 10A schematically illustrates a layout 403 of apertures 329-5, 329-6 in hexagonal arrangements that can be formed in each of an upper and a lower electrode. In layout 403, apertures 329-6 are located horizontally adjacent to apertures 329-5 in the orientation of FIG. 10A, but this need not necessarily be the case; apertures 329-6 could be formed with vertical offsets, horizontal offsets or both relative to apertures 329-5. Also, in the arrangement shown in FIG. 10A, a horizontal movement of one electrode, in the orientation of the drawing, would result in overlap between apertures 329-5 and 329-6 with a smaller movement than a vertical movement of the electrode in the orientation of the drawing.

Figure 10B:
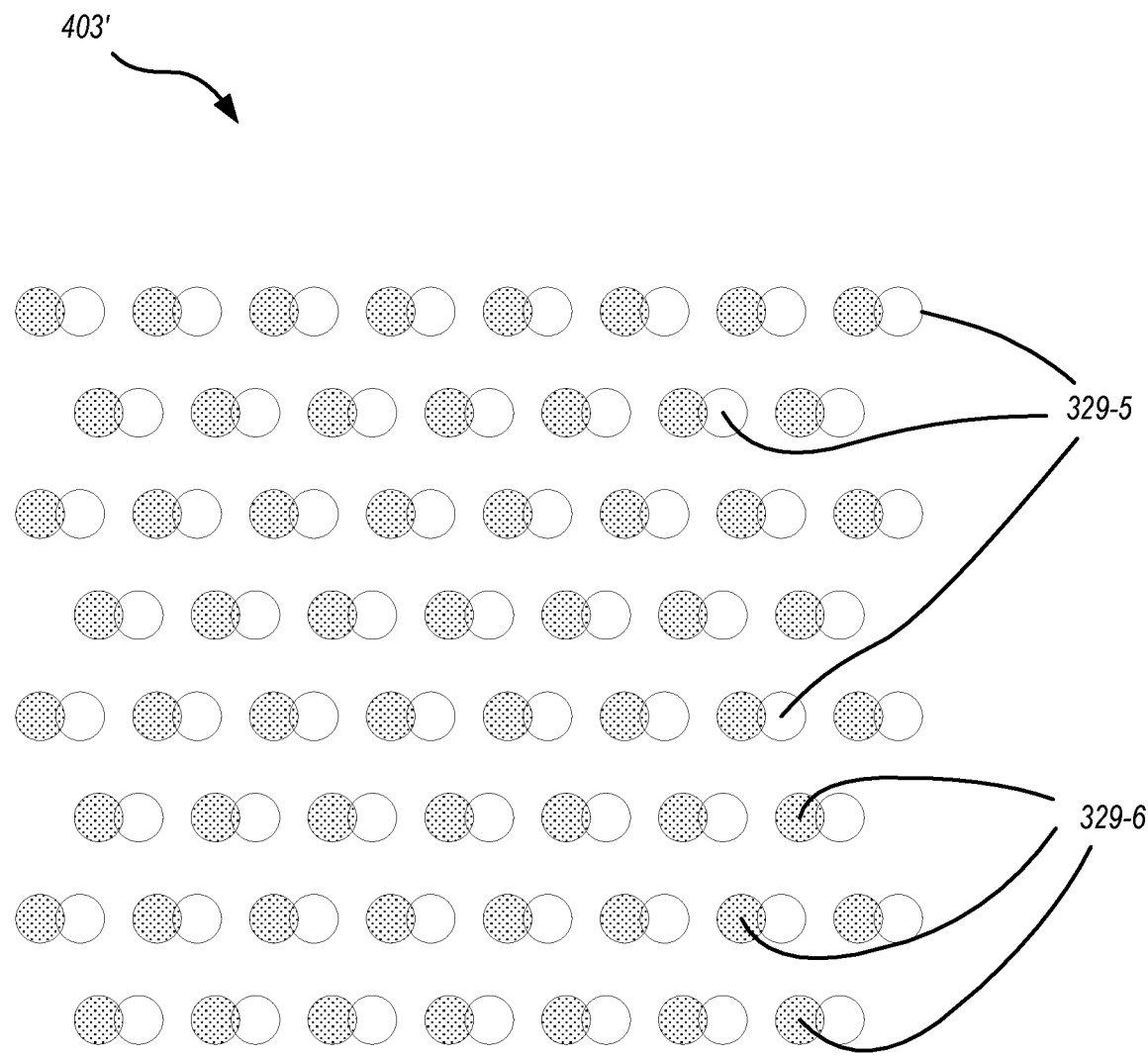
FIG. 10B schematically illustrates the a layout of apertures shown in FIG. 10A, with one of the sets of apertures shifted such that a small overlap occurs between each pair of apertures, in a plan view, according to one or more embodiments.

FIG. 10B schematically illustrates a layout 403' of apertures 329-5, 329-6 in the hexagonal arrangements shown in FIG. 10A, but shifted such that a small overlap occurs between each pair of apertures 329-5, 329-6. It can be seen that, in the orientation of FIG. 10B, if apertures 329-5 are shifted further in the horizontal direction, overlap between pairs of apertures 329-5, 329-6 will increase or decrease quickly, but if apertures 329-5 are shifted in the vertical direction, overlap between pairs of apertures 329-5, 329-6 will increase or decrease slowly. This demonstrates that, for some layouts, sensitivity of overlap area to movement can be particular to the direction of movement, which can be used to provide relatively coarse and fine processing adjustments. That is, in the orientation of FIG. 10B, horizontal movements would provide coarse adjustments (i.e., relatively large changes of overlap area with respect to motion) while, after overlap is established, vertical movements would provide fine adjustments.

Figure 11:
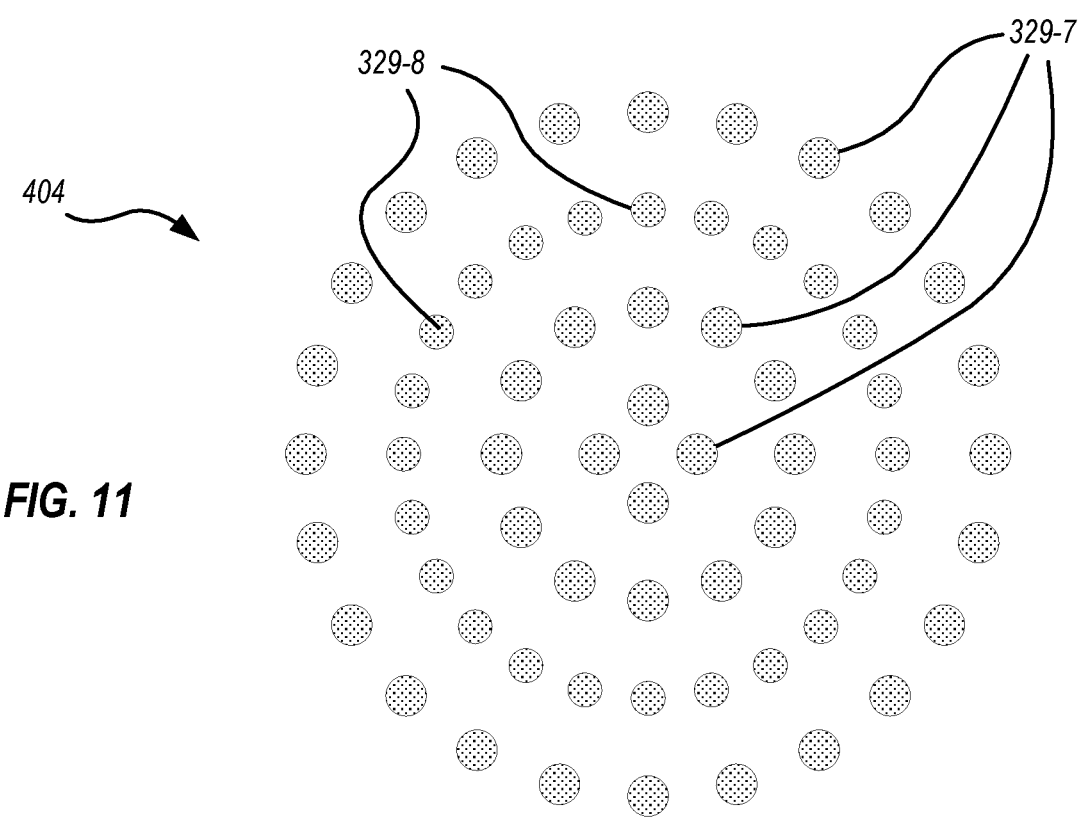
FIG. 11 schematically illustrates a layout of apertures in a radial arrangement, in a plan view, according to one or more embodiments.

FIG. 11 schematically illustrates a layout 404 of apertures 329-7, 329-8 in a radial arrangement. It can be appreciated that care may be needed in radial layouts so that a ratio of aperture area to electrode area remains uniform at different radii, and so that distances between adjacent apertures 329 allow for placement of apertures on an opposing electrode without forming unintended overlaps in an initial position of the electrodes It may be advantageous to form apertures 329 of differing sizes depending on their location within a layout; note that apertures 329-8 are illustrated as smaller than apertures 329-7.

Figure 12:
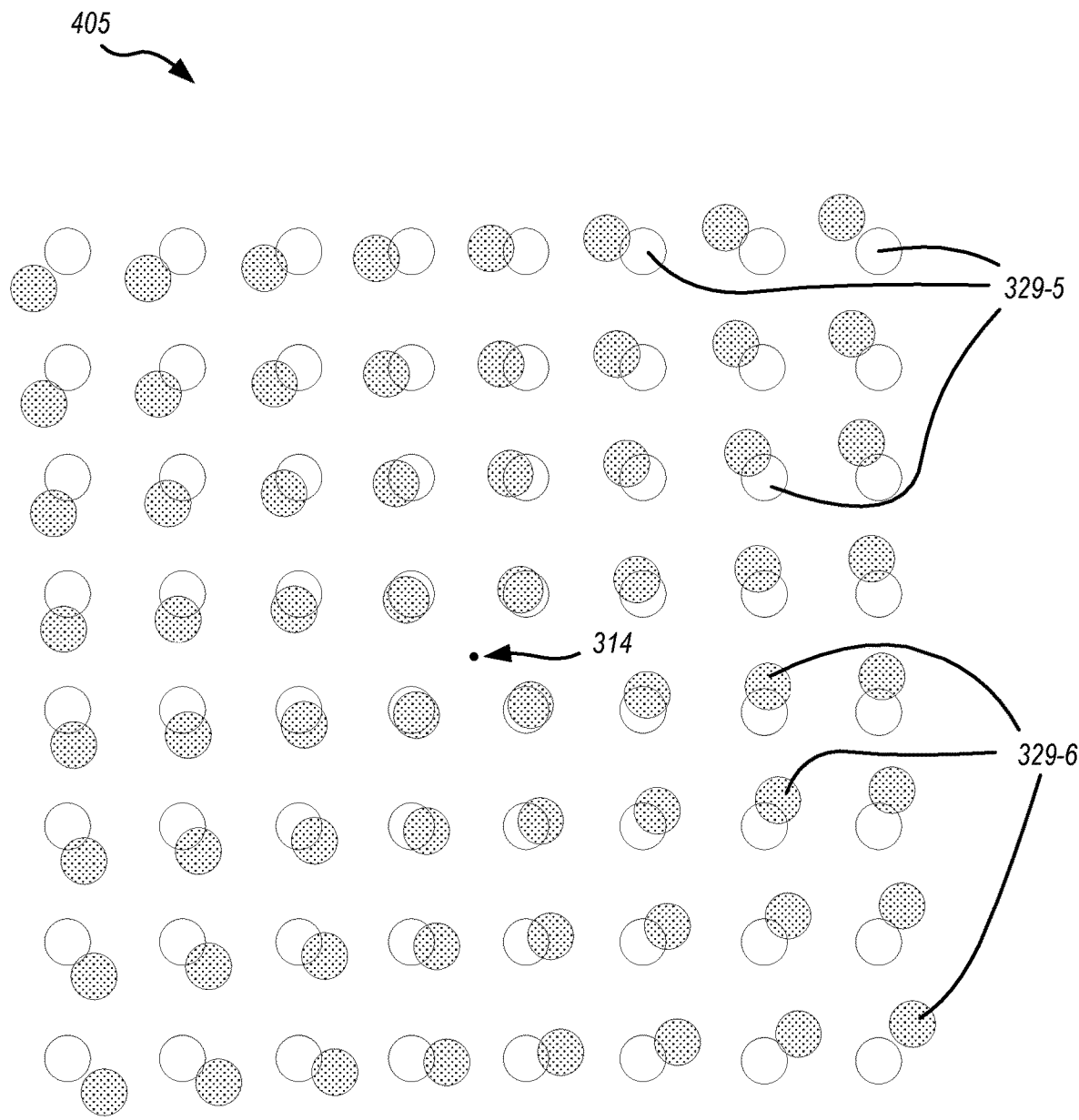
FIG. 12 schematically illustrates a layout in which one set of apertures has been rotated relative to another set of apertures, in a plan view, according to one or more embodiments.

Rotation of electrodes can have a variety of effects on aperture alignment that can depend on initial aperture layout, size, spacing, and positioning relative to axis of the rotation. For example, FIG. 12 schematically illustrates a layout 405 in which one set of apertures 329-6 has been rotated by 5 degrees relative to another set of apertures 329-5. The choice of a 5 degree rotation is for illustrative purposes only; in general, rotations used to generate overlap or non-overlap of apertures will be smaller, for reasons explained more fully below. Axis 314 is shown in layout 405, and is selected such that apertures 329-5 and 329-6 are arranged symmetrically about axis 314 in both the horizontal and vertical directions, in the orientation of FIG. 12. Because of this symmetry, similarly placed ones of apertures 329-5 and 329-6 are at about the same radii from axis 314 as one another. It can be seen that overlap among apertures 329-5 and 329-6 varies uniformly by radius from a large overlap near axis 314 to a small overlap at edges of layout 405. In corners of layout 405 where apertures 329-5 and 329-6 are furthest from axis 314, the overlap disappears entirely. It can be appreciated that larger apertures 329-5 and 329-6 might mitigate the change in amount of overlap across layout 405 as shown, that is, larger apertures at the same locations would overlap more, even out to edges of layout 405. However, it can also be appreciated that if layout 405 represents apertures formed in only part of an electrode, that beyond the apertures shown, rows and columns of apertures 329-5 will begin to overlap with apertures 329-6 in different rows and columns. This can bring about radial effects (e.g., moiré patterns) such as regions where apertures overlap, then regions where apertures do not overlap, then regions where apertures overlap again, and so on, as radius from axis 314 increases.

Figure 13:
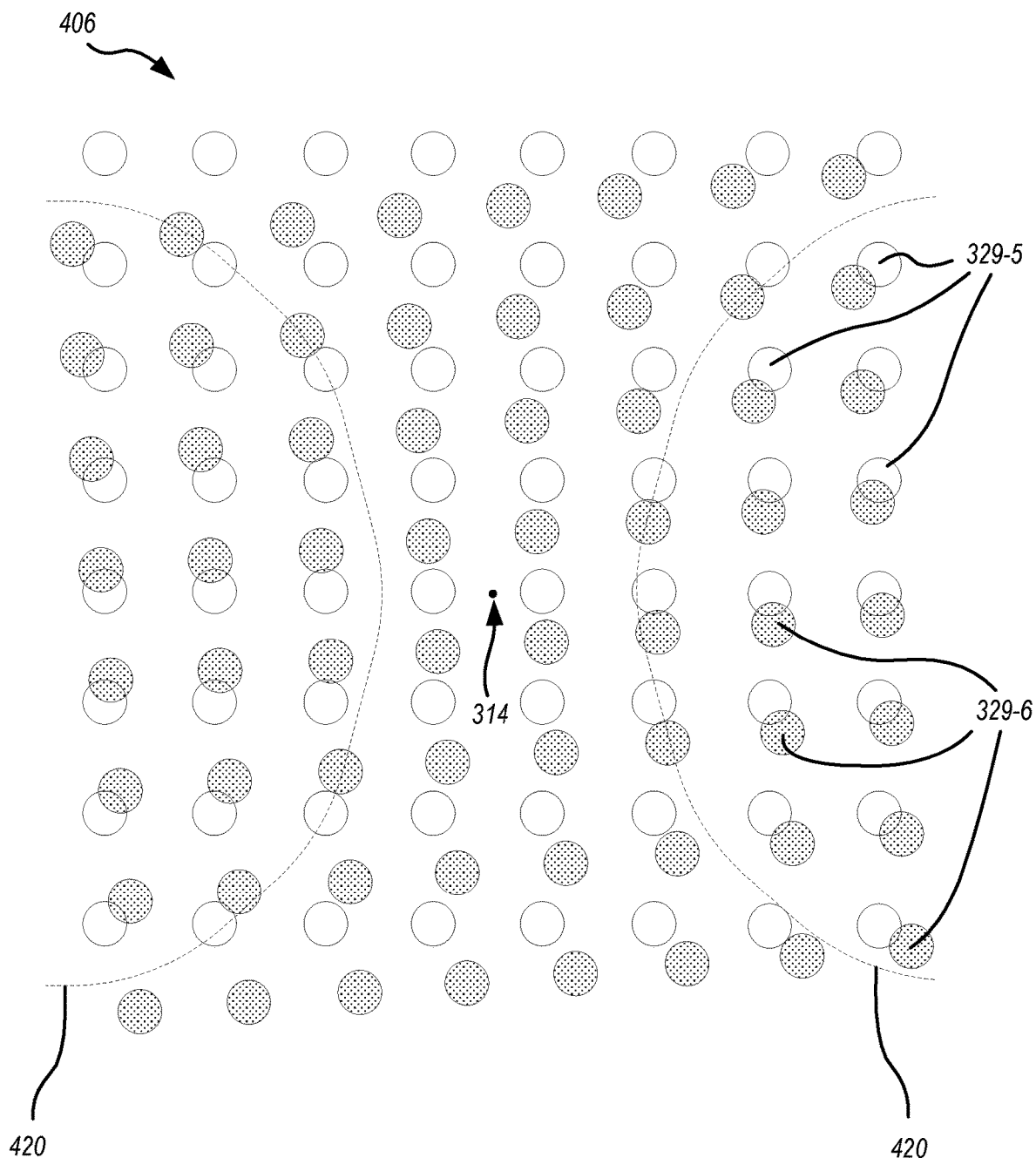
FIG. 13 schematically illustrates another layout in which one set of apertures has been rotated relative to another set of apertures, in a plan view, according to one or more embodiments.

In another example, FIG. 13 schematically illustrates a layout 406 in which, again, one set of apertures 329-6 has been rotated by 5 degrees relative to another set of apertures 329-5. Axis 314 is shown in layout 406, and this time is selected such that apertures 329-6 are arranged symmetrically about axis 314 in both the horizontal and vertical directions, in the orientation of FIG. 12; however, one row of apertures 329-5 are aligned with axis 314, but axis 314 falls between adjacent columns of apertures 329-5. Because of this arrangement, rows and columns of apertures 329-6 move from misalignment to alignment with respect to rows and columns of apertures 329-5 in a way that is not radially dependent, as in layout 405. In regions bounded by broken lines 420 on either side of layout 406, some overlap exists between apertures 329-5 and 329-6. It can be seen that if extended through large arrays of apertures 329-5 and 329-6, regions would exist where different rows and/or columns of apertures 329-5 and 329-6 would overlap. In certain embodiments, this effect can be used to generate accordingly asymmetric process effects. However, these would be unusual cases. More importantly, it can be seen that these effects tend to form an upper limit on useful values of rotation that depend on size, spacing and arrangement of apertures 329.

Figure 14:
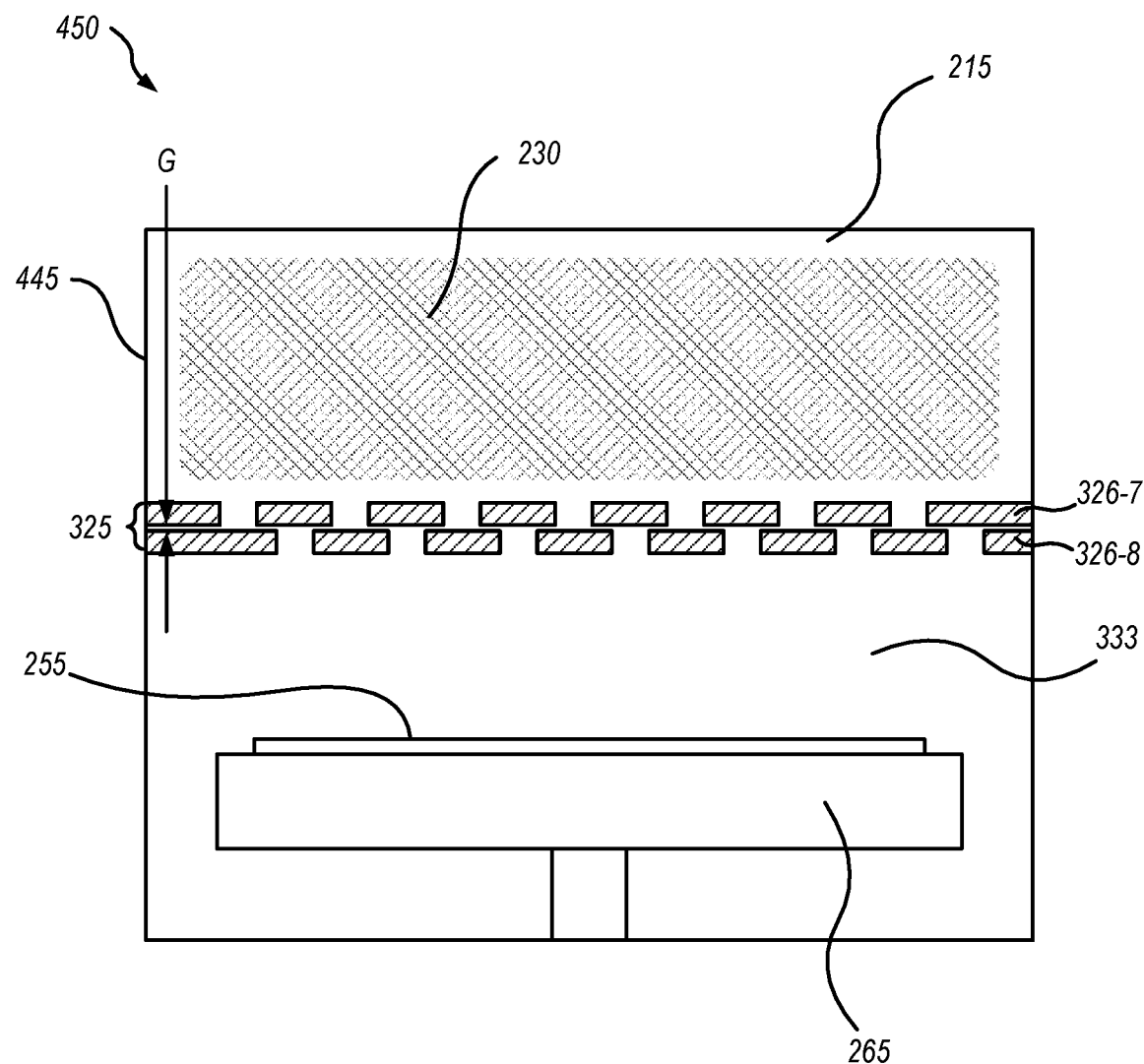
FIG. 14 is a schematic diagram illustrating major components of a plasma processing system, according to one or more embodiments.

Two piece electrode assemblies can be used to enable several new methods of providing plasma products, or operating or optimizing plasma apparatus, a few examples of which are now discussed. FIG. 14 is a schematic diagram illustrating major components of a plasma processing system 450 for reference to such components in the method descriptions that follow; additional components illustrated in other drawings herein may also be referred to in the method descriptions. System 450 includes a housing 445 to which other components of system 450 are directly or indirectly coupled. That is, housing 445 can serve as a support portion for other components of system 450, like support portion 335, FIGS. 6A, 7. System 450 includes a plasma generation region 215 that is operable to produce a plasma 230. Plasma generation region 215 may be a chamber having substantially the same width as housing 445 (e.g., like first plasma generation region 215, FIG. 2), or may be a smaller chamber or remote plasma system (e.g., like remote plasma system 201, FIG. 2). Plasma generation region 215 is in fluid communication with a downstream chamber 333 that may be a process chamber (e.g., containing pedestal 265 to support workpiece 255) or may be an intermediate chamber, with a process chamber located further downstream. Two-piece electrode assembly 325, here shown with electrodes 326-7 and 326-8, is capable of modifying the fluid communication between plasma generation region 215 and downstream chamber 333. For example, when electrodes 326-7 and 326-8 are positioned in close proximity with one another (e.g., with gap G therebetween in the range of 0.005 inch to 0.050 inch, and apertures within electrodes 326-7 and 326-8 do not overlap, electrodes 326-7 and 326-8 will keep plasma 230 (if present) within plasma generation region 215, and will prevent most free electrons and/or ions from passing through to downstream chamber 333. However, if actuators or adjustable couplers (not shown in FIG. 14, see FIGS. 6A, 7, 8) move either of electrodes 326-7 and 326-8 relative to one another so as to open up gap G, or cause apertures of electrodes 326-7 and 326-8 to align or nearly align (e.g., come within about three times the amount of gap G from alignment) then plasma, free electrons and/or ionic species may be allowed to pass from plasma generation region 215 to downstream chamber 333. Thus, if plasma products that pass from plasma generation region 215 to downstream chamber 333 are called a first portion at a first time, and are called a second portion at a second time after the relative positions of electrodes 326-7 and 326-8 change, the difference between the first position and the second position causes two piece electrode assembly 325 to modify a proportion of ionized species to neutral species in the second portion relative to the first portion.

Figure 15:
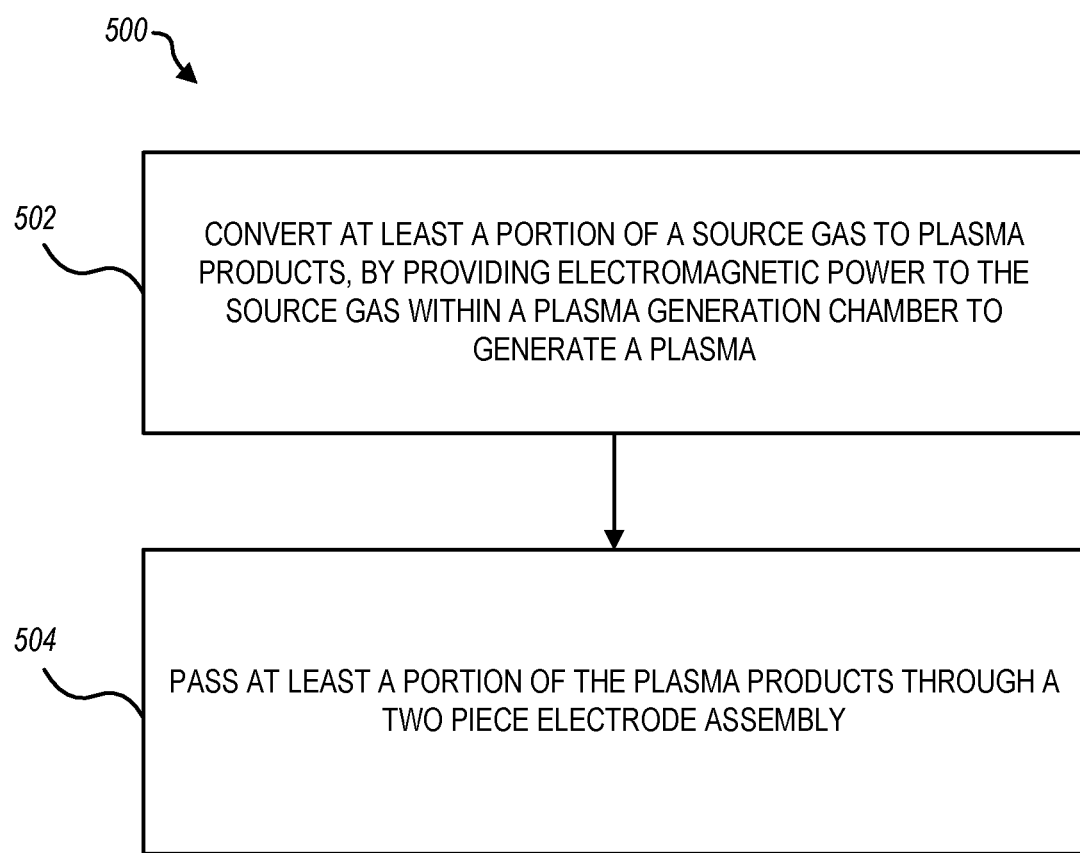
FIG. 15 is a flowchart of a method for providing plasma products, according to one or more embodiments.

FIG. 15 is a flowchart of a method 500 for providing plasma products. In a first step 502, at least a portion of a source gas is converted to plasma products, by providing electromagnetic power to the source gas within a plasma generation chamber to generate a plasma. Examples of step 505 include operating remote plasma system 201, FIG. 2, to supply plasma products through gas inlet assembly 205; generating a plasma 216 within first plasma generation chamber 215; or operating plasma system 450, FIG. 14, to generate a plasma 230 within plasma generation chamber 215. A second step 504 passes at least a portion of the plasma products through a two piece electrode assembly. The two piece electrode assembly is understood to include electrodes 326 arranged as disclosed herein. That is, a first one of the electrodes defines a plurality of first apertures therethrough, a first side of the first electrode facing the plasma such that the portion of the plasma products passes through the plurality of first apertures to a second planar side of the first planar electrode Examples of the first electrode include electrodes 326-1, FIG. 4; 326-3, FIG. 5; 326-5, FIGS. 6A, 6B and 7; and 326-7, FIG. 14. A second one of the electrodes defines a plurality of second apertures therethrough, a third planar side of the second electrode being disposed facing the second side of the first electrode. The second electrode is coupled with the first electrode such that the third planar surface is disposed adjacent to the second planar surface, with a gap distance G therebetween. The first and second apertures are arranged within the first and second electrodes such that none of the first apertures aligns with any of the second apertures to form an open straight-line path extending through both the first and second electrodes. The gap distance G is sufficient to allow neutral species of the plasma products to pass through the gap as the first portion of the plasma products, but is sufficiently small to cause ionized species of the plasma products to interact with the first or second electrodes and not to pass through the two piece electrode assembly. Examples of the second electrode include electrodes 326-2, FIG. 4; 326-4, FIG. 5; 326-6, FIGS. 6A, 6B and 7; and 326-8, FIG. 14. An example of a gap distance G that is sufficient to allow neutral species of the plasma products to pass through the gap as the first portion of the plasma products, but is sufficiently small to cause ionized species of the plasma products to interact with the first or second electrodes and not to pass through the two piece electrode assembly, is a gap distance G of 0.005 inch to 0.050 inch.

Figure 16:
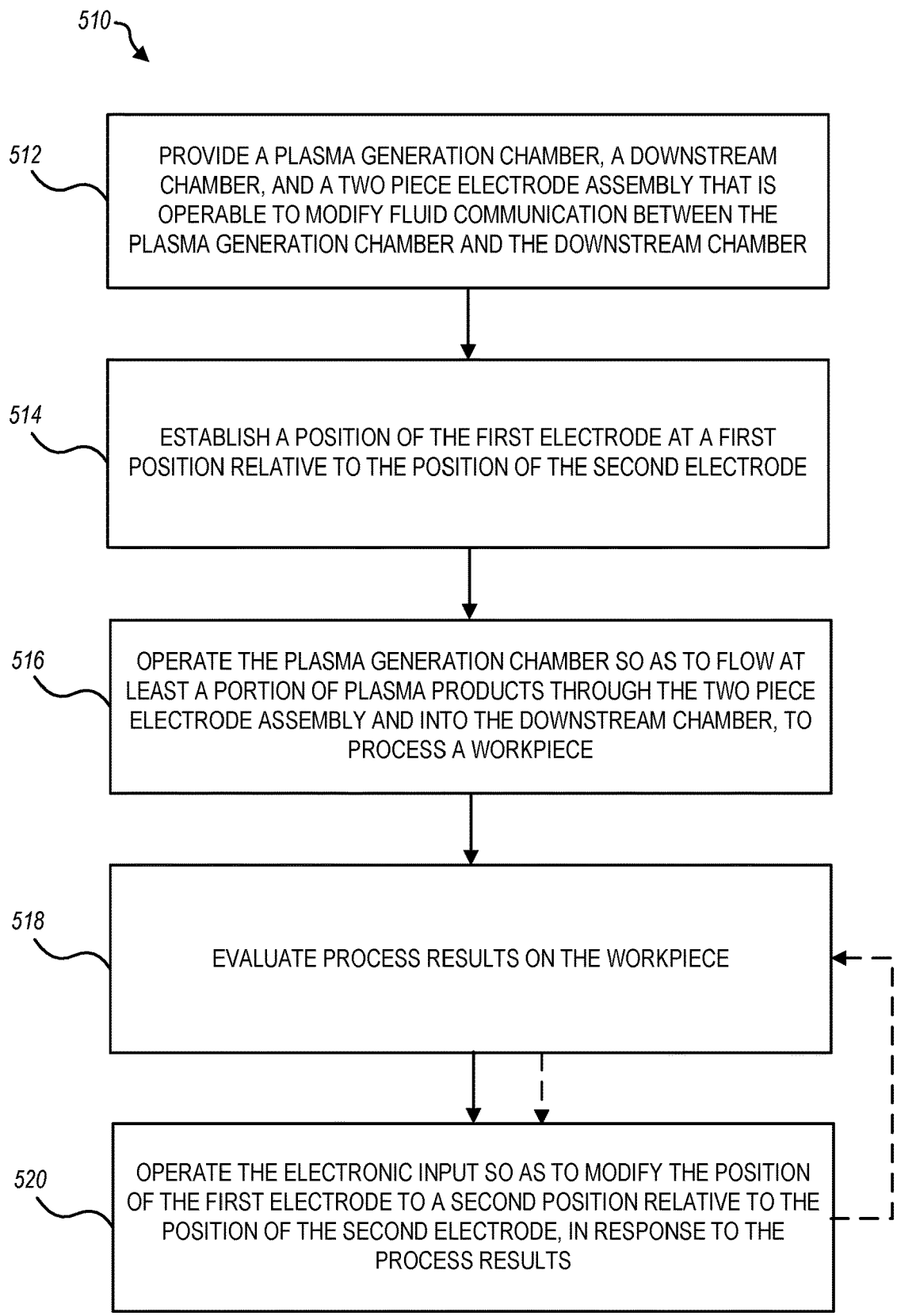
FIG. 16 is a flowchart of a method for providing plasma products, according to one or more embodiments.

FIG. 16 is a flowchart of a method 510 for optimizing a plasma apparatus. A first step 512 provides a plasma generation chamber, a downstream chamber, and a two piece electrode assembly between the plasma generation chamber and the downstream chamber. The two piece electrode assembly is operable to modify fluid communication between the plasma generation chamber and the downstream chamber. An example of step 512 is providing plasma generation chamber 215 and downstream chamber 333, with two piece electrode assembly 325 between the two, as shown in FIG. 14. The first electrode defines a plurality of first apertures therethrough. A first surface of the first electrode faces the plasma generation chamber, and a second planar surface of the first electrode faces away from the plasma generation chamber. A second electrode defines a plurality of second apertures therethrough. A third planar surface of the second electrode faces the second planar surface of the first electrode, and a fourth surface of the second electrode faces the downstream chamber. Examples of the first and second electrodes include electrodes 326-1 and 326-2, FIGS. 4; 326-3 and 326-4, FIGS. 5; 326-5 and 326-6, FIGS. 6A, 6B and 7; and 326-7 and 326-8, FIG. 14. One or more actuators couple the first and second electrodes. The one or more actuators are operable, in response to an electronic input, to adjust a position of the first electrode relative to a position of the second electrode. Examples of the actuators are any of actuators 330 or 330-1 through 330-8, FIGS. 6A, 7 and 8. The one or more actuators can be operated to provide at least one position of the first electrode relative to the second electrode such that the third planar surface is disposed adjacent to the second planar surface, with a first gap distance between 0.005 inch and 0.050 inch therebetween, and the first and second apertures are arranged within the first and second electrodes such that none of the first apertures aligns with any of the second apertures to form an open straight-line path extending through both the first and second electrodes. A second step 514 of method 510 establishes a position of the first electrode at a first position relative to the position of the second electrode. An example of step 514 is establishing relative positions of electrodes 326-1 and 326-2, FIGS. 4; 326-3 and 326-4, FIGS. 5; 326-5 and 326-6, FIGS. 6A, 6B and 7; and 326-7 and 326-8, FIG. 14. Step 514 may, for example, operate any of actuators 330 or 330-1 through 330-8, FIGS. 6A, 7 and 8 to establish the relative positions. A third step 516 of method 510 operates the plasma generation chamber so as to flow at least a portion of plasma products generated thereby, through the two piece electrode assembly and into the downstream chamber, to process a workpiece. An example of step 516 is operating plasma system 450, FIG. 14, to generate a plasma 230 within plasma generation chamber 215, flowing at least a portion of plasma products generated thereby into downstream chamber 333, and processing workpiece 255.

A fourth step 518 of method 510 evaluates process results on the workpiece. Examples of step 518 include evaluating process results on the workpiece using any known method such as, but not limited to visual inspection, optical or mechanical measurements of layers or geometries formed therein, scanning electron microscope (SEM) or atomic force microscopy (AFM) based measurements, and/or electronic measurements, such as resistivity or other characteristics of circuit elements, or actual circuits, formed in or on the workpiece. Step 518 may also include further processing steps to place the workpiece in condition for measurement, such as stripping photoresist or otherwise preparing the workpiece for measurement by a particular instrument. Step 518 may also include evaluating the process results at multiple locations on the workpiece. A further step 520 operates the electronic input so as to modify the position of the first electrode to a second position relative to the position of the second electrode, in response to the process results. Examples of step 520 include operating electronic input to any of actuators 330 or 330-1 through 330-8, FIGS. 6A, 7 and 8, to reposition either the first or the second electrode. Optionally, steps 518 and 520 may be repeated until an optimal process point, that is, an optimal relative positioning of the first and second electrodes, is found.

Method 510 thus provides a process control mechanism that takes advantage of the fact that the two piece electrode assemblies discussed herein can change process conditions at the workpiece. For example, step 518 may reveal process results that should be changed across the entire workpiece. In this case, step 520 may reposition the first and/or second electrodes to allow a larger or smaller proportion of free electrons and/or ionic species everywhere, by increasing or decreasing the gap distance G, or by moving the first and second electrodes such that alignment between apertures on the first and second electrodes is affected across an entire working area of the electrodes (e.g., as in FIGS. 9C, 10B). In a special case, step 518 may reveal process results of more than one type, such as effects of an etch on different materials such as silicon dioxide, silicon nitride, polysilicon, one or more metals, photoresist, or the like, and/or specific geometries, such as bulk etch of a layer vs. the ability to clear remnants found in corners, trenches or the like. In this special case, step 520 may be repeated, and may reposition the first and/or second electrodes, first, to optimize one type of processing (e.g., an etch step on bulk material) and, second, to optimize a different type of processing (e.g., photoresist strip or an etch step to clear remnants).

In another example, step 518 may reveal process results that should be changed to provide, or eliminate, a bias across the workpiece. In this case, step 520 may reposition the first and/or second electrodes to change parallelism of the first and second electrodes, that is, to provide gap G with a tilt or gradient across the working area, as discussed above in connection with height actuators 330-3, 330-4 and 330-5. In yet another example, step 518 may reveal process results that should be changed to provide, or eliminate, a radial effect across the workpiece. In this case, step 520 may reposition the first and/or second electrodes to increase, or decrease, radial effects by increasing, or decreasing, overlap of apertures, as discussed above in connection with FIG. 12. These changes may be made alone, or with other changes to plasma conditions (e.g., input gas flows, pressure, RF power and the like). Also, steps 518 and 520 may optionally be repeated, as shown in FIG. 16 with dashed arrows.

Figure 17:
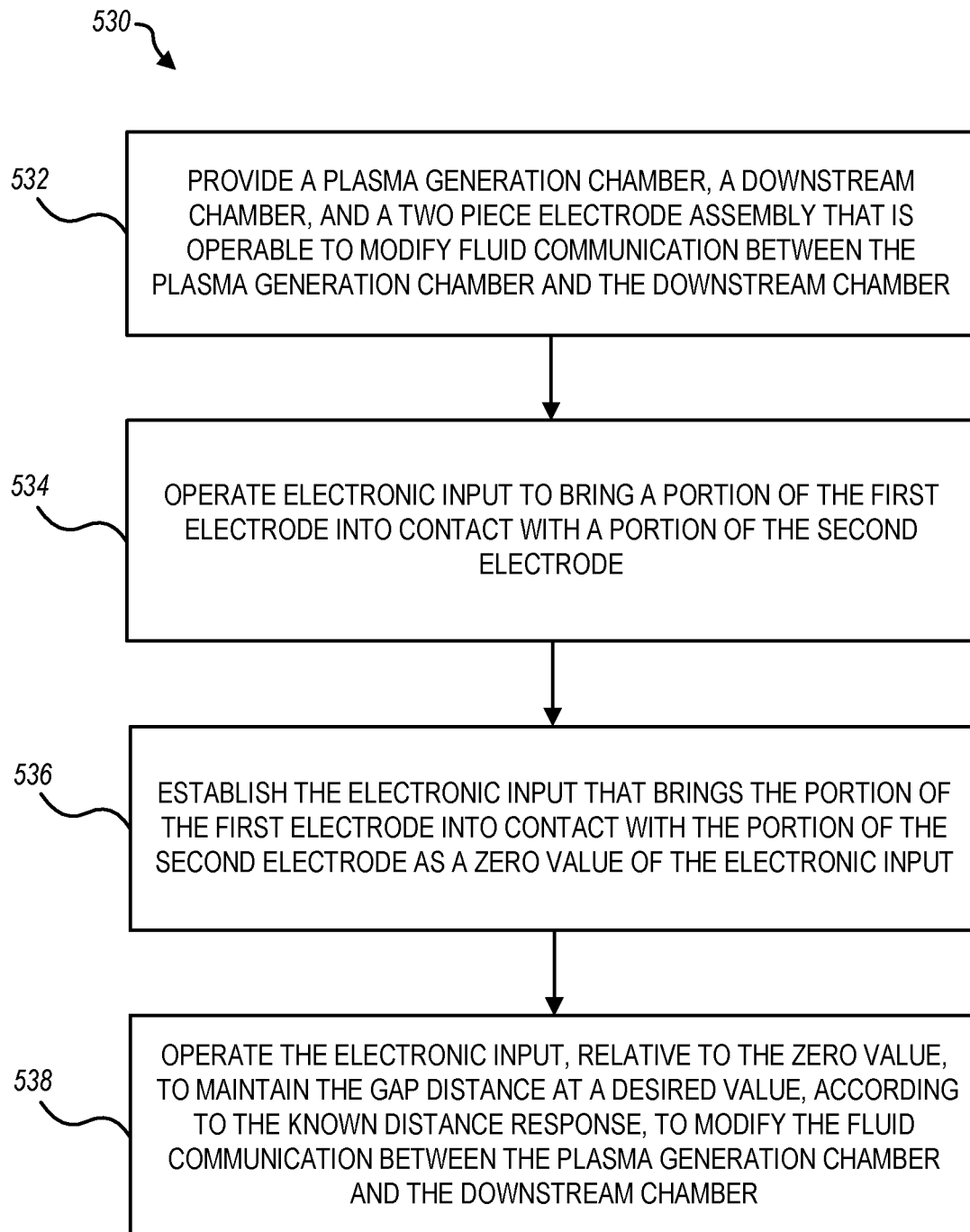
FIG. 17 is a flowchart of a method for providing plasma products, according to one or more embodiments.

FIG. 17 is a flowchart of a method 530 for optimizing a plasma apparatus. A first step 532 provides a plasma generation chamber, a downstream chamber, and a two piece electrode assembly between the plasma generation chamber and the downstream chamber. The two piece electrode assembly is operable to modify fluid communication between the plasma generation chamber and the downstream chamber. An example of step 532 is providing plasma generation chamber 215 and downstream chamber 333, with two piece electrode assembly 325 between the two, as shown in FIG. 14. The first electrode defines a plurality of first apertures therethrough. A first surface of the first electrode faces the plasma generation chamber, and a second planar surface of the first electrode faces away from the plasma generation chamber. A second electrode defines a plurality of second apertures therethrough. A third planar surface of the second electrode faces the second planar surface of the first electrode, and a fourth surface of the second electrode faces the downstream chamber. The first and second apertures are arranged within the first and second electrodes such that none of the first apertures aligns with any of the second apertures to form an open straight-line path extending through both the first and second electrodes. Examples of the first and second electrodes include electrodes 326-1 and 326-2, FIGS. 4; 326-3 and 326-4, FIGS. 5; 326-5 and 326-6, FIGS. 6A, 6B and 7; and 326-7 and 326-8, FIG. 14. An actuator couples the first and second electrodes. The actuator is operable, in response to an electronic input, to adjust a gap distance between the second and third planar surfaces. An example of the actuator is any of actuators 330 or 330-1 through 330-3, FIGS. 6A, 7 and 8. A second step 534 operates the electronic input so as to bring a portion of the first electrode into contact with a portion of the second electrode. An example of step 534 is operating actuator 330, FIG. 6A, to bring electrodes 326-5 and 326-6, FIGS. 6A, 6B, into contact with one another. Optionally, the contact between the first and second electrode occurs between a protrusion of one of the electrodes, and a surface of the other electrode; an example of such protrusion is region 360, FIG. 6B. Also optionally, when the portions of the first and second electrodes are in contact with one another, the gap distance away from the point of contact is less than a gap distance sufficient to allow passage or ionized species through the first apertures, the gap and the second apertures, for example 0.005 inches or less. A third step 536 establishes the electronic input to the actuator that corresponds to contact between the portions of the first and second electrodes, as a zero value of the electronic input. An example of step 536 is providing electronic input to a stepper motor acting as height actuator 330 until surface 302 is in contact with region 360, releasing the electronic input with the electrodes in contact, and reestablishing the electronic input at the position of contact. Another example of step 536 is bringing the electrodes into contact using the electronic input, and storing a value of the electronic input at the point of contact as the zero value. A further step 538 operates the electronic input, relative to the zero value, so as to maintain the gap distance at a desired value, according to the known distance response, to modify the fluid communication between the plasma generation chamber and the downstream chamber. An example of step 538 is operating the electronic input to the stepper motor acting as height actuator 330 so as to maintain gap distance G at a desired value, in accordance with a known distance response of the stepper motor.

Figure 18:
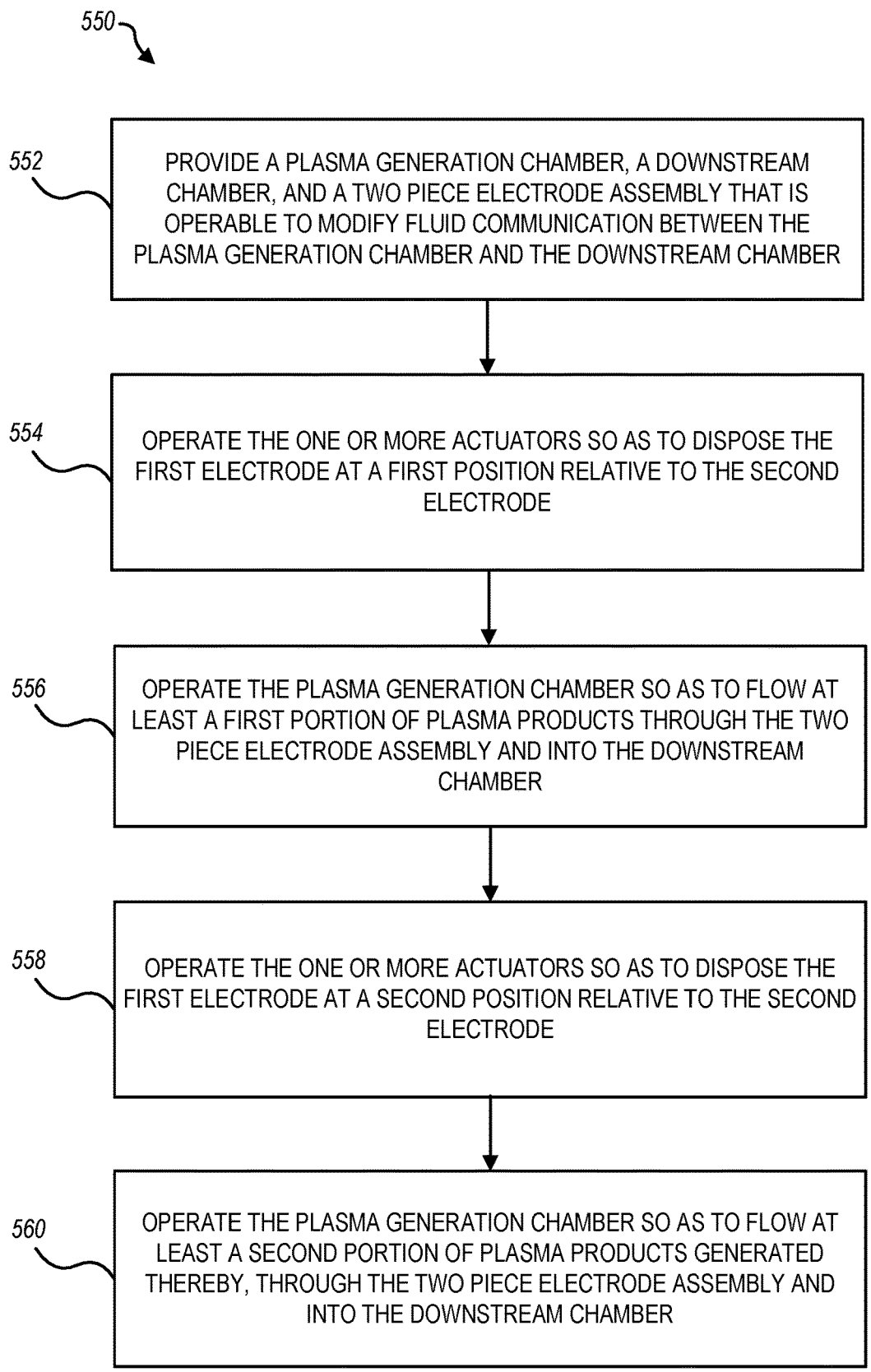
FIG. 18 is a flowchart of a method for providing plasma products, according to one or more embodiments.

FIG. 18 is a flowchart of a method 550 for optimizing a plasma apparatus. A first step 552 provides a plasma generation chamber, a downstream chamber, and a two piece electrode assembly between the plasma generation chamber and the downstream chamber. The two piece electrode assembly is operable to modify fluid communication between the plasma generation chamber and the downstream chamber. An example of step 552 is providing plasma generation chamber 215 and downstream chamber 333, with two piece electrode assembly 325 between the two, as shown in FIG. 14. The first electrode defines a plurality of first apertures therethrough. A first surface of the first electrode faces the plasma generation chamber, and a second planar surface of the first electrode faces away from the plasma generation chamber. A second electrode defines a plurality of second apertures therethrough. A third planar surface of the second electrode faces the second planar surface of the first electrode, and a fourth surface of the second electrode faces the downstream chamber. The second and third surfaces are separated by a gap distance. Examples of the first and second electrodes include electrodes 326-1 and 326-2, FIGS. 4; 326-3 and 326-4, FIGS. 5; 326-5 and 326-6, FIGS. 6A, 6B and 7; and 326-7 and 326-8, FIG. 14. One or more actuators couple the first and second electrodes. The actuators are operable to adjust a position of the first electrode relative to a position of the second electrode. Examples of the actuators are any of actuators 330 or 330-1 through 330-8, FIGS. 6A, 7 and 8. Each of the actuators is characterized by a range of adjustment. For at least one position within the ranges of adjustment of the one or more actuators, the first and second apertures are arranged within the first and second electrodes such that none of the first apertures aligns with any of the second apertures to form an open straight-line path extending through both the first and second electrodes, and the gap distance is between 0.0005 inch and 0.050 inch.

A second step 554 of method 550 operates the one or more actuators so as to dispose the first electrode at a first position relative to the second electrode. An example of step 554 is operating any of actuators 330 or 330-1 through 330-8, FIGS. 6A, 7 and 8 to establish relative positions of electrodes 326-1 and 326-2, FIGS. 4; 326-3 and 326-4, FIGS. 5; 326-5 and 326-6, FIGS. 6A, 6B and 7; and 326-7 and 326-8, FIG. 14. Step 554 is optional in the sense that the one or more actuators may or may not be operated as method 550 begins, that is, the first and second electrodes may already be in the desired first position. Optionally, also, a workpiece may be transferred into the downstream chamber, either before or after step 554, but this is not required.

A third step 556 of method 510 operates the plasma generation chamber so as to flow at least a first portion of plasma products generated thereby, through the two piece electrode assembly and into the downstream chamber. An example of step 556 is operating plasma system 450, FIG. 14, to generate a plasma 230 within plasma generation chamber 215, and flowing at least a first portion of plasma products generated thereby into downstream chamber 333. As discussed above, certain plasma products may not flow into the downstream chamber, due to the gap distance between the electrodes being sufficiently small, and/or the apertures being out of alignment, so as to keep free electrons and ions generated in the plasma from flowing through the two piece electrode assembly. Also, in step 556, a workpiece may or may not be processed. For example, step 556 may be a chamber cleaning or conditioning operation. A fourth step 558 operates the one or more actuators so as to dispose the first electrode at a second position relative to the second electrode. An example of step 558 is operating any of actuators 330 or 330-1 through 330-8, FIGS. 6A, 7 and 8 to establish relative positions of electrodes 326-1 and 326-2, FIGS. 4; 326-3 and 326-4, FIGS. 5; 326-5 and 326-6, FIGS. 6A, 6B and 7; and 326-7 and 326-8, FIG. 14 to move one or both of the first electrode and the second electrode. Step 558 may, for example, increase or decrease gap distance G, and may do so across an entire working area of the two piece electrode assembly, or may impart a tilt or gradient to the gap distance at various locations of the assembly. Alternatively or in addition to modifying the gap distance, step 558 may translate and/or rotate one or both of the first and second electrodes, to modify proximity or alignment of apertures therein. Step 558 may occur concurrently with step 552, that is, plasma generation may cease while the actuator(s) move the electrode(s), or plasma generation may continue. Also, optionally, a workpiece may be transferred into the downstream chamber, either before or after step 558, but this is not required.

A further step 560 operates the plasma generation chamber so as to flow at least a second portion of plasma products generated thereby, through the two piece electrode assembly and into the downstream chamber. An example of step 560 is operating plasma system 450, FIG. 14, to generate a plasma 230 within plasma generation chamber 215, and flowing at least a first portion of plasma products generated thereby into downstream chamber 333. Again, as discussed above, certain plasma products may not flow into the downstream chamber, due to the gap distance between the electrodes being sufficiently small, and/or the apertures being out of alignment, so as to keep free electrons and ions generated in the plasma from flowing through the two piece electrode assembly. Again also, in step 560, a workpiece may or may not be processed. For example, step 560 may be a chamber cleaning or conditioning operation.

Because it includes the ability to reposition one or both electrodes of a two piece electrode assembly, and such repositioning can be used to modify fluid communication between a plasma generation chamber and a downstream chamber, method 550 enables processing within a downstream chamber in ways that are believed previously unavailable in plasma systems. For example, changes in gap distance and/or aperture alignment between the two electrodes can enable a designer or engineer of a plasma process to selectively allow or restrict flow of plasma, free electrons and/or ionic species through the electrode assembly without physically changing out one electrode (e.g., a faceplate, showerhead, ion suppressor, plasma blocking screen or the like) for another.

Embodiments herein may be rearranged and may form a variety of shapes. For example, many components shown in FIGS. 2-5, 6A, 7, 8 and 14, such as gas inlet assembly 205, plasma generation chamber 215, faceplate 217, an ion suppressor 223, a showerhead 225, and a workpiece support or pedestal 265, and others may be substantially radially symmetric about a central axis, for processing a circular semiconductor wafer as workpiece 255. However, such features may be of any shape that is consistent with use as a plasma source for other workpieces. Exact numbers and placement of features for introducing and distributing gases and/or plasma products, such as diffusers, face plates and the like, may also vary. Moreover, multiple locations may be used to generate plasmas, and other components of plasma processing systems herein may be configured to add or mix gases with other gases and/or plasma products as they pass through such systems toward a downstream chamber or process chamber. As also suggested by FIGS. 2-5, 6A, 7, 8 and 14, many system components will form perforate planar shapes within central regions of a plasma processing unit so as to provide uniform process conditions across a working area 291 that is about the size of a planar workpiece 255, but the system components may also form different shapes such as flanges, thickness changes, solid imperforate surfaces, and the like at edges of the plasma processing system for structural purposes. Extent of the working area may vary, in embodiments, to accommodate different workpiece sizes, especially but not limited to, diameters of wafers as workpieces 255. When workpiece 255 is a wafer, the working area 291 will generally, but need not always, encompass a central region that extends at least to one-half of a radius of each such system component.

Specific details are given in the above description to provide a thorough understanding of the embodiments. However, it is understood that the embodiments may be practiced without these specific details. For example, well-known processes, structures, and techniques may be shown without unnecessary detail in order to avoid obscuring the embodiments. While the principles of the disclosure have been described above in connection with specific apparatuses and methods, it is to be clearly understood that this description is made only by way of example and not as limitation on the scope of the disclosure.

It is appreciated that the arrangements shown are exemplary only; other embodiments may differ greatly in configuration, including how source gases are introduced, how electrodes and insulators are arranged, how plasma and/or plasma products are handled after generation, and how grooves are formed in insulators. It is contemplated that the techniques and apparatus disclosed herein are applicable to these and other arrangements wherein conductive material builds up during use and thereby creates leakage and/or discharge paths.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. An apparatus for distributing plasma products, comprising:
    a first electrode characterized by a first surface and a second surface opposite the first surface, wherein the first electrode defines a plurality of first apertures extending therethrough;
    a second electrode characterized by a first surface facing the second surface of the first electrode and a second surface opposite the first surface of the second electrode, wherein:
        the second electrode is disposed beneath the first electrode;
        the second electrode defines a plurality of apertures that are configured to permit at least one of plasma, free electrons, or ionic species to pass into a processing region that is configured to receive a substrate for processing;
        the second electrode forms at least one component selected from the group consisting of a faceplate, a showerhead, an ion suppressor, and a plasma blocking screen;
        the second electrode defines a plurality of second apertures extending therethrough; and
        a gap distance is formed between the first electrode and the second electrode; and
    one or more adjustable couplers operable to adjust one or more of translation or rotation of the first electrode with respect to the second electrode.

2. The apparatus of claim 1, wherein the one or more adjustable couplers are adjustable using a hand tool, but are not operably coupled with actuators.

3. The apparatus of claim 1, wherein the one or more adjustable couplers are actuators that activate in response to electronic input.

4. The apparatus of claim 1, further comprising one or more RF grounding straps that maintain a common electrical potential for each of the first electrode, the second electrode, and the one or more adjustable couplers.

5. The apparatus of claim 1, wherein the gap distance is substantially maintained during adjustment of translation or rotation of the first electrode.

6. The apparatus of claim 5, wherein the one or more adjustable couplers are operable to adjust the first electrode between a first position and a second position, where at the second position, one or more apertures of the plurality of first apertures is aligned with one or more apertures of the plurality of second apertures forming an open straight-line path extending through the first electrode and the second electrode.

7. The apparatus of claim 1, wherein a first one of the one or more adjustable couplers is operable to adjust the gap distance.

8. The apparatus of claim 7, wherein the first one of the one or more adjustable couplers is a single adjustable coupler operable to adjust the gap distance while substantially maintaining parallelism between the second surface of the first electrode and the first surface of the second electrode.

9. The apparatus of claim 8, further comprising:
    a housing; and
    a suspension mechanism, wherein one of the first and second electrodes is fixedly coupled with the housing, and the other of the first and second electrodes is coupled with the suspension mechanism.

10. The apparatus of claim 9, wherein:
    the first one of the one or more adjustable couplers comprises a stepper motor; and
    the suspension mechanism comprises a bracket coupled with one or more springs.

11. The apparatus of claim 7, wherein a second one of the one or more adjustable couplers is operable to adjust parallelism between the second surface of the first electrode and the first surface of the second electrode.

12. The apparatus of claim 11, wherein:
    the first one of the one or more adjustable couplers adjusts the gap distance at a first attachment point about a periphery of the second electrode, and
    second and third adjustable couplers of the one or more adjustable couplers adjust the gap distance at second and third attachment points about the periphery of the second electrode.

13. A plasma processing apparatus, comprising:
a plasma generator;
a processing chamber operable to receive a workpiece within a processing region of the processing chamber, wherein the processing chamber comprises:
   a first electrode characterized by a first surface and a second surface opposite the first surface, wherein the first electrode defines a plurality of first apertures extending therethrough;
   a second electrode characterized by a first surface facing the second surface of the first electrode and a second surface opposite the first surface of the second electrode, wherein the second electrode defines a plurality of second apertures extending therethrough, wherein a gap distance is formed between the first electrode and the second electrode;
   one or more adjustable couplers operable to adjust one or more of translation or rotation of the first electrode with respect to the second electrode; and
   a substrate support disposed beneath the first electrode and the second electrode, a topmost surface of the substrate support being spaced apart from the first electrode and the second electrode.

14. The plasma processing apparatus of claim 13, wherein the one or more adjustable couplers are adjustable using a hand tool, but are not operably coupled with actuators.

15. The plasma processing apparatus of claim 13, wherein the one or more adjustable couplers are actuators that activate in response to electronic input.

16. The plasma processing apparatus of claim 13, further comprising one or more RF grounding straps that maintain a common electrical potential for each of the first electrode, the second electrode, and the one or more adjustable couplers.

17. The plasma processing apparatus of claim 13, wherein the gap distance is substantially maintained during adjustment of translation or rotation of the first electrode.

18. The plasma processing apparatus of claim 17, wherein the one or more adjustable couplers are operable to adjust the first electrode between a first position and a second position, where at the second position, one or more apertures of the plurality of first apertures is aligned with one or more apertures of the plurality of second apertures forming an open straight-line path extending through the first electrode and the second electrode.

19. A plasma source, comprising:
a plasma generation region;
an RF power supply coupled with the plasma generation region; and
a two piece electrode assembly that bounds the plasma generation region on one side, the two piece electrode assembly comprising:
   a first electrode defining a plurality of first apertures,
   a second electrode defining a plurality of second apertures, wherein:
      the second electrode is disposed beneath the first electrode,
      the second electrode defines a plurality of apertures that are configured to permit at least one of plasma, free electrons, or ionic species to pass into a processing region that is configured to receive a substrate for processing; and
      the second electrode forms at least one component selected from the group consisting of a faceplate, a showerhead, an ion suppressor, and a plasma blocking screen, and
   one or more adjustable couplers coupled with the first electrode.

20. The plasma source of claim 19, wherein the one or more adjustable couplers are operable to adjust at least one of:
   a gap distance between the first electrode and the second electrode; and
   lateral alignment between the plurality of first apertures and the plurality of second apertures.

* * * * *